United States Patent [19]
Higashino et al.

[11] Patent Number: 5,869,846
[45] Date of Patent: Feb. 9, 1999

[54] SUPERCONDUCTING JUNCTION DEVICE

[75] Inventors: Hidetaka Higashino, Kyoto; Masahiro Sakai; Kentaro Setsune, both of Osaka, all of Japan

[73] Assignee: Matsushita Electric Industrial Co., Ltd., Osaka, Japan

[21] Appl. No.: 621,819

[22] Filed: Mar. 22, 1996

[30] Foreign Application Priority Data

Mar. 24, 1995 [JP] Japan .................................. 7-066109

[51] Int. Cl.$^6$ .................................................. H01L 29/06
[52] U.S. Cl. ...................................... 257/31; 257/34
[58] Field of Search ......................... 331/107.5, 50, 331/56; 333/219; 343/792.5; 505/190, 238, 204, 329, 701, 702, 853, 854; 257/31, 34

[56] References Cited

U.S. PATENT DOCUMENTS

| 5,065,096 | 11/1991 | Mück et al. | 333/219 |
| 5,339,457 | 8/1994 | Kawasaki et al. | 505/853 |

FOREIGN PATENT DOCUMENTS 0 080 532  6/1983  European Pat. Off. .
62-232982 10/1987  Japan .

OTHER PUBLICATIONS

J. H. Hinken, *Superconductor Electronics —Fundamentals and Microwave Applications*, pp. 84–85 and English translation. 1989.

Steven T. Ruggiero et al., *Superconducting Devices*, pp. 146–165. 1990.

*Primary Examiner*—Carl Whitehead, Jr.
*Attorney, Agent, or Firm*—Merchant, Gould, Smith, Edell, Welter & Schmidt, P.A.

[57] ABSTRACT

A superconducting junction device which is easily manufactured, multifunctional, and utilizes the superconducting Josephson effects is described. A first junction (Josephson junction) and a second junction (Josephson junction) are disposed o a substrate across a coupling portion of a dielectric. The first junction comprises a first upper electrode, a first barrier layer and a first lower electrode. The second junction comprises a second upper electrode, a second barrier layer and a second lower electrode. The first lower electrode and the second lower electrode are connected in series via a connecting electrode. A superconducting reflecting wall which is connected via the connecting electrode is provided around the two Josephson junctions including the coupling portion.

12 Claims, 17 Drawing Sheets

SUPERCONDUCTING JUNCTION DEVICE

FIELD OF THE INVENTION

This invention relates to a superconducting junction device using the Josephson effect. Such an element can be used for apparatuses like a local oscillator, for example, a switch, a memory, a very-high speed pulse oscillator and a superconducting mixer.

BACKGROUND OF THE INVENTION

A superconducting junction device is used in a condensed quantum state. Thus it is coupled to an adjacent external electromagnetic field coherently when junction voltage is applied, so it can be operated at high speed with less power. Therefore, a superconducting junction device can be used for various electronics fields, and it has been studied to be applied to a superconducting computer or a superconducting mixer. Especially after an oxide high temperature superconducting material with a critical temperature above liquid nitrogen was invented, the superconducting junction has been studied from the viewpoint of miniaturization of a cooling element or decrease of operating cost.

Oscillators using the superconducting phenomenon (hereinafter superconducting oscillators) are represented by a Josephson junction device comprising a laminated structure of a superconductor, an intermediate layer and another superconductor. The intermediate layer is composed of a material such as an insulator, a semiconductor, a normal conductor or a superconducting material. The current-voltage characteristic of the device varies depending on the kind of the intermediate materials. In a superconducting electrode of a Josephson junction device, the superconducting order parameter, whose amplitude is proportional to the square root of the number of superconducting particles, is substantially stabilized in its phase as well as its amplitude. On the other hand, the amplitude of the superconducting order parameter decreases in the intermediate layer. Therefore, when a voltage V is applied between the electrode (voltage stage), the voltage V is applied to the intermediate layer in which superconducting order parameters of the both superconducting electrodes are weakly linked. The superconducting particles injected from a superconducting electrode with higher energy to the other superconducting electrode through the intermediate layer release an amount of energy as a value of eV ("e" is an element charge of $1.6021892 \times 10^{-19}$C, and the energy eV is an outer voltage obtained when passing the intermediate layer). This phenomenon is due to the fact that the superconducting particles remain in the condensed state and in the lowest-energy state. The superconducting particles are in a strong coherent state and they demonstrate a wave motional characteristic. Therefore, the particles are transmitted to the other superconducting electrode due to the tunneling phenomenon, then directly couple to an external electromagnetic field without collisional relaxation with quasiparticles or phonons, and radiate photon energy. In other words, they radiate electromagnetic waves directly. When external electromagnetic waves irradiate to the Josephson junction device, the electromagnetic wave is partially resonant-absorbed at the tunneling intermediate layer. The absorbable wave is limited to have a frequency of f=2eV/h(Hz) of energy, equal to the energy difference eV, where h is Planck's constant of $6.626176 \times 10^{-34}$J·s. As a result, the current tunneling through the Josephson junction device increases by the rate of the absorbed photon numbers. This phenomenon is well known as the AC Josephson effect. Based on this principle, electromagnetic waves with precisely-defined oscillation frequency are irradiated, and a terminal voltage of a Josephson junction device which is constant current-biased is principally determined to be used as a voltage standard element. On the other hand, the Josephson junction device is applied with a constant voltage bias and used as an oscillator. In general, the impedance of a Josephson junction is low. Thus for a practical use, it is necessary to compose serial-parallel arrays by connecting many Josephson junction devices with similar characteristics in order to coordinate with load impedance, to supply power to the oscillation output, and to increase the standard voltage level of the voltage standard element.

FIG. 21 is a partially cutaway view in perspective of a Josephson junction array which is used for a traveling wave type voltage standard element ("Superconductor Electronics: Fundamentals and Microwave Applications" by J. H. Hinken, translated by Takuo Sugano, published by SPRINGER VERLAG Tokyo in 1992, FIG. 4-2 p.85) As shown in FIG. 21, a ground plane 112 is formed on a substrate 111, whereon a Josephson junction array is formed as a part of the transmission line. The Josephson junction array comprises dielectric 113 (specific dielectric constant $\epsilon_{r1}=5.7$, thickness $d_1=1$ $\mu$m), a lower electrode 114, a tunnel oxide film 115 of a lead oxide film and an upper electrode 116. The dimension of each Josephson junction is predetermined to be 27 $\mu$m (length)×70 $\mu$m (width), and the repeat length $l_k$ is determined at every 100 $\mu$m, in order to prevent out-of-phase coupling between the Josephson junctions. Such an element is constructed to avoid out-of-phase coupling between the Josephson junctions by standardizing the characteristics, so that the operation can be stabilized.

An oscillator is also applied with Josephson junction arrays. For such an oscillator, the characteristic is determined by synchronizing the phases of the electric waves emitted by each of the Josephson junctions connected in series or in parallel (cf. "Superconducting Device", edited by S. T. Ruggiero and D. A. Rudman, Academic Press, Inc., 1990 p.146–165). In this case, the characteristics of the elements should be similar to stabilize the operation, so that the phase difference between the Josephson oscillating currents of fundamental mode flowing in each of the junction elements and the induced current with the external electromagnetic field will be fixed. As a result, a phase synchronization is realized between the currents flowing in the Josephson junction elements. In other words, the Josephson junctions are weakly linked to each other via the currents flowing in the junctions or via oscillating electromagnetic field of the outer parts. When the element is used, the oscillation voltage and the current of the junctions are phase-synchronized to each other. According to this embodiment, the oscillation power is added by the number of the Josephson junctions, so a higher power level is realized. Moreover, the impedance between the array terminals can be greater, so the matching to the transmission line impedance is improved.

In the above examples, the characteristic of a single Josephson junction is effectively used, while the non-linear characteristic is not changed.

Another superconducting element is explained below. A non-linear element of FIG. 22 is indicated in Published Unexamined (Kokai) Japanese Patent Application No. Hei 6-5937. In FIG. 22, a first weak link-type Josephson junction and a second weak link-type Josephson junction are disposed on a substrate 206, and the junctions are connected by an intermediate bridge 203. The first Josephson junction comprises a first superconducting electrode 201, a first weak link 204 and the intermediate bridge 203 (superconductor). The second Josephson junction comprises a second superconducting electrode 202, a second weak link 205 and the intermediate bridge 203. If the superconducting order parameter in the intermediate bridge 203 changes periodically in the space, the critical current density in the intermediate bridge 203 has a value larger than the value determined by its own material constant. As a result, the voltage between the superconducting electrodes 201 and 202 decreases. In other words, a negative resistance area appears in the voltage-current characteristic. The material of the substrate 206 is strontium titanate. The superconducting thin films of the superconducting electrodes 201 and 202 are YBCO-based oxide superconducting thin films having a thickness of 50–150 nm and a critical temperature of 90 Kelvin. The weak links (204, 205) are YBCO-based oxide superconducting thin films having a thickness of 0.5–2 nm and a critical temperature of 70 Kelvin. The intermediate bridge 203 is a YBCO-based oxide superconducting thin film having a thickness of 5–100 nm and a critical temperature is 80 Kelvin. The interval between the first and second superconducting electrodes is 5 μm. Since the intermediate bridge 203 is a superconductor, shielding effect will occur due to the Meissner effect. Thus magnetic flux coupling or electromagnetic coupling is negligible between the first and second weak links (204, 205).

A very thin (1–2 nm) and uniform insulator tunnel barrier should be formed to obtain the switching characteristic using a single Josephson junction device. However, it is very difficult and the manufacturing process yield is low. For the present, only niobium superconducting material is suitable for this purpose. It is difficult to form a tunnel barrier of an insulator, using other superconducting materials like oxide superconductors such as YBCO base, Bi oxide (BSCCO) base or thallium base material. When a single Josephson junction is used as an oscillator due to its AC Josephson effects, the oscillating fundamental frequency is mainly determined to be $483597.9 \times V_{appl}$(GHz) where the applied voltage of the Josephson junction is $V_{appl}$(V). This is the reason why the Josephson junction is used as a voltage standard element. However, the oscillating frequency will change according to the voltage deviation. To solve this problem, the element needs a precision standard voltage source to stabilize the oscillation frequency, but it is not preferable for a practical use. The same problem is found in a Josephson junction array having the same critical current and normal resistance.

The non-linear characteristic element is disclosed in Published Unexamined (Kokai) Japanese Patent Application No. Hei 6-5937. The characteristic depends on the junction interface between the superconductor and the weak links. Though the inventors manufactured the disclosed element using advanced junction-forming skill, the characteristic disclosed in the reference was not obtained. When the cross-section of the element was examined through a microscope, interfacial irregularity in the atomic order was found. This might be the reason why the negative resistance as is mentioned by the inventors was not obtained. According to Ginzburg-Landau theory relating to this reference, the connecting condition of the order parameter between the superconductor and the weak links at the interface determines the shape of the superconducting order parameter in the superconductor (including the intermediate layer). If the interface is not well-formed, the order parameter at the interface decreases. Thus a monotonous damping solution (or monotonous increasing solution) in a lower energy level is realized as a stable state, compared to another solution which periodically changes in a space of higher energy level. As a result, the non-linear characteristic of this reference is not observed when such an interfacial deterioration exists. In such a case, the characteristics of the two independent Josephson junctions are added up in volume. According to the reference, the junction interface accuracy should be strictly controlled, and the manufacturing is extremely difficult.

The AC Josephson effect of a single Josephson junction is used when an oscillator using a superconducting element is prepared. In such a case, the instantaneous oscillation frequency changes in proportion to the voltage. Thus the voltage variation and the voltage noise cause the variation of oscillation frequency and the change of oscillation output line. Therefore, an ultra-low impedance drive using a precision standard voltage source is needed to construct an oscillator with stable frequency, using a conventional Josephson junction or Josephson junction array. The practice is difficult or costly. Furthermore, the output oscillation is emitted by radiating to free space, so the method is inconvenient. In order to compose an oscillator which enables driving a load circuit, the circuit is constructed so that the bias voltage is applied through a load impedance etc. However, other problems are found in the method. For instance, the Josephson oscillation becomes a non-linear oscillation at an instantaneous frequency in proportion to the instantaneous voltage applied to the junction terminal by a load impedance, whereby the frequency spectral purity of the oscillation is decreased. As a result, the oscillation output power is lowered if it is passed through a band-pass filter with high Q value to raise the frequency spectral purity.

Furthermore, the amplitude of the oscillating current coupled with a tank circuit with high Q value is permitted to change only in a narrow range because of the non-linear oscillation. The range depends on the floating impedance of the bias circuit and the junction, thus the oscillation output power is as small as $10^{-7}$W or less (cf. "PHYSICS AND APPLICATIONS OF THE JOSEPHSON EFFECT" by A. Barone and G. Paternò, translated by Takuo Sugano, Hiroshi Ohta and Tsutomu Yamashita, published by Kindaikagakusha Shuppan in 1988, p.289). Moreover, the impedance of the Josephson junction is as small as several $\Omega$ or less, so the impedance cannot be matched with that of free space one or with that of transmission circuit one. In a case of space radiation, the output level which is obtainable is only $10^{-3}$ to $10^{-4}$ times the oscillation amplitude at most.

When the Josephson junctions are formed in an array, problems are found with respect to the frequency variation as in the case of a single Josephson junction, which is obvious from the operation principle. It is necessary to manufacture dozens or hundreds of Josephson junction devices having the same characteristics and connect them in order to match the impedance for the purpose of improving the output coupling. As a result, the superconducting oscillator becomes bigger (with larger area) and the manufacturing yield deteriorates.

In addition, an element must have the negative resistance characteristic at the operation frequency if an oscillator is composed by using the conventional element having the negative resistance characteristic. Texts of electric circuit generally teach that this condition is an absolute requirement.

SUMMARY OF THE INVENTION

This invention aims to provide a superconducting junction using Josephson effects in order to solve these problems of the conventional techniques. Such an element is easily manufactured and is multi-functional.

This invention also aims to provide a superconducting oscillator which realizes both resonance circuit and Josephson non-linear oscillation phenomena.

In order to obtain these advantages, a superconducting junction device of this invention has plural Josephson junctions which are connected in series and have different critical current values. The closest distance between the junctions is not more than 10 μm, and a coupling portion of a dielectric is provided between the junctions.

It is preferable that a bias circuit and a resonance circuit element are further provided. The bias circuit supplies operation current, and the resonance circuit element is connected between the electrodes of the Josephson junction with minimum critical current value. It is also preferable that a band-pass filter which is connected capacitively or electromagnetically is further provided to at least one of the elements selected from the group consisting of an electrode and a resonance circuit element of the Josephson junction with minimum critical current values.

It is preferable that the Josephson junctions are connected in series. According to this composition, the phase-relations between a Josephson current flowing in a Josephson junction and another current are different each other. The other current is induced from another Josephson junction to the first Josephson junction by a magnetic flux coupling via a coupling portion or an electromagnetic coupling. The medium of the electromagnetic coupling is a magnetic flux or an electromagnetic wave radiated from the other Josephson junction.

It is preferable that the Josephson currents of the Josephson junctions are coupled in anti-phase and connected in series by adjacently disposing two layered-type Josephson junctions across a coupling portion. Each of the layered-type Josephson junctions is formed by laminating a lower electrode, a barrier layer including a dielectric or inductive material, and an upper electrode. It is also preferable in this case that a reflecting wall including a superconductor or a Josephson junction is provided around the two Josephson junctions including the coupling portion.

It is preferable that the Josephson currents of the two Josephson junctions are respectively coupled in anti-phase and connected in series. For this purpose, the two superconducting electrodes that are located on the same side across the coupling portion are coupled. It is also preferable in this case that a shield film of a superconductor is provided across a dielectric around the two Josephson junctions including the coupling portion.

It is preferable that the Josephson currents of the two Josephson junctions are respectively coupled in anti-phase and connected in series. For this purpose, two weak link-type Josephson junctions are adjacently formed on a substrate across a coupling portion, and the two superconducting electrodes which are located on the same side across the junction part of the Josephson junctions are connected. It is also preferable in this case that a reflecting wall including a superconductor is provided across a dielectric to at least one of the group including a lower face, an upper face and side of the two weak link-type Josephson junctions including the coupling portion.

It is preferable that at least one of the group including external capacitor and external resistance is connected electrically in parallel to at least one of the Josephson junctions.

It is preferable that the material of at least one of the superconducting electrodes composing the Josephson junctions is an oxide superconductor.

According to this invention, plural Josephson junctions with different critical current values are disposed across a coupling portion of dielectric so that the closest distance between the junctions is not more than 10 μm. Thus, a strong non-linear characteristic can be seen in the junction voltage of a Josephson junction having a smaller critical current value, when the other Josephson junctions having a greater critical current value is traveling from the zero-voltage state to the voltage state around the bias current.

It is preferable in this invention that a bias circuit and a resonance circuit element are also provided. The bias circuit supplies operation current and the resonance circuit is connected between the end electrodes of the Josephson junction having minimum critical current. According to this embodiment, the following advantages are expected. If a resonance circuit element is connected in series and/or in parallel between the electrodes of the Josephson junction having a minimum critical current value (hereinafter minimum junction), a resonance circuit is composed by the resonance circuit element, the capacitance of the minimum junction and a normal resistance, etc. When an operation current is supplied by the bias circuit, the minimum junction oscillates based on the fed-back (positively fed-back in a case of anti-phase coupling) Josephson effects, and the voltage of the resonant frequency component amplified according to the Q value and appears on the resonance circuit. Accordingly, the oscillation voltage occurs in the capacitance of the minimum junction composing the resonance circuit, namely, between the electrodes of the minimum junctions, thus modulating the Josephson current of the minimum junction at the resonance frequency. The modulated Josephson current of the minimum junction is coupled to the other Josephson junction having a bigger critical current value, and it is again coupled to the minimum junction. After the repetition of such couplings, the voltage between the electrodes of the minimum junction is determined without self-contradiction. As a result, an oscillation output having superior frequency spectral purity can be extracted from the resonance circuit or the terminal of the minimum junction. It is also preferable that a band-pass filter which is coupled capacitively or electromagnetically is further provided to at least one selected from the group including of electrodes and resonance circuit elements of Josephson junctions with the minimum critical current values. According to this embodiment, an oscillation output with a superior frequency spectral purity can be easily supplied to a load circuit.

In another case, a resonance circuit element is connected in parallel and/or in series to a single Josephson junction or connected between the both end electrodes of the Josephson junction array. In this case, oscillation cannot be obtained at a single frequency. The reason is as follows. The Josephson oscillation is caused by the non-linear oscillation phenomenon. The non-linear oscillation phenomenon means that the sine value of the phase difference of the superconducting order parameter flows as a Josephson junction current. And the superconducting order parameter oscillates at an instantaneous frequency in proportion to the voltages between terminals of the Josephson junctions. This non-linear oscillation phenomenon is a substantial phenomenon which occurs when the resonance circuit and the junction's Josephson oscillation cannot be separated since the degree of freedom of the oscillation is one (e.g. the phase difference of the order parameter between the electrodes or the junction terminal voltage).

According to the oscillator of this invention, the degree of freedom of the oscillation is at least two (e.g. the terminal voltage of the second junctions and the terminal voltage of the first junction of the superconducting non-linear element). Thus it is possible to separate the second junction terminal voltage generated from the resonance circuit and another current flowing in the second junction. The oscillation frequency can be locked to the resonance frequency of the resonator. Such a phenomenon is observed since the first junction absorbs and completes the non-linear frequency component via the coupling with strong phases which are different from each other. The non-linear frequency component is generated by the second junction due to Josephson oscillation, and the resonance frequency of the resonance circuit is not included in the component. Such an oscillation operation may be seen in any bias current values. Especially, if the superconducting junction is in a bias state to be the competing oscillation state, the oscillation current amplitude is increased, and an oscillation output having a large amplitude can be obtained.

It is preferable that both of the Josephson junctions are connected in series so that the Josephson current flowing in a Josephson junction and another current have different phases. The first current is induced by the second Josephson junction in the first junction by magnetic flux coupling via a coupling portion or electromagnetic coupling by way of an electromagnetic wave irradiated from the second Josephson junction. According to this embodiment, the following advantages are obtained. The currents flowing in every Josephson junction are modulated in anti-phase by other Josephson junction currents. Here, the first Josephson junction has the greater critical current value ($I_{c1}$), while the second Josephson junction has a smaller value ($I_{c2}$). The current applied to the superconducting junction device is I, and the voltage between the terminals is V. When $I<I_{c2}$ ($I_{c2}<I_{c1}$), the currents flowing in the first and second Josephson junctions are under the critical current value. Therefore, a zero-voltage state is retained and V=0. When $I_{c2}<I<I_{cp1}$ ($<I_{c1}$), the current under the critical current value flows in only the first Josephson junction and the zero-voltage state is retained. Therefore, the oscillation current reflecting the anti-phase coupled second Josephson junction current flows in the first Josephson junction current. The oscillation current flowing in the first Josephson junction is coupled in anti-phase to the second Josephson junction current. As a result, the first Josephson junction current is partially added to in the same phase (positively fed back), and an oscillation current which is bigger compared to a case without any coupling, flows into the second Josephson junction current. Thus the voltage generated in the second junction is stronger. Accordingly, the voltage-current characteristic of the second Josephson junction is greater in the voltage axis direction compared to a case without coupling. When $I_{cp1}<I$, the current value flowing in the first Josephson junction exceeds $I_{cp1}$, and the phase difference of the Josephson junctions causes phase slip. Thus the state is changed to the voltage state, and the Josephson oscillation current mainly flows in the first Josephson junction current. This is coupled to the second Josephson oscillation current in anti-phase, and a random beat oscillation is generated in the second current. Due to the non-linear characteristic of the Josephson oscillation, a terminal voltage is generated. The frequency spectrum of the terminal voltage spreads. The terminal voltage is filtered by the time-constant circuit comprising the junction's capacitance and the normal conductance. In this case, the positive feed-back effect of the second Josephson junction current via the first current is controlled due to the random non-linear beat oscillation. Thus the voltage of the second Josephson junction becomes smaller compared to the case where $I_{cp2}<I<I_{cp1}$. The characteristic-variation of the second Josephson junction voltage is remarkable while $I_{cp1}$ and I are almost the same. Therefore, around this current, the second Josephson junction is rapidly decreased and a negative resistance area is generated in the voltage-current characteristic, when the first Josephson junction is changed from the zero-voltage state to the voltage state. If such a negative resistance is coupled to the external resonator and used, an oscillator with a microwave band which is stable and convenient is realized. The microwave band is not depend on the junction application voltage.

It is preferable that two pairs of layered-type Josephson junctions are adjacently disposed across a coupling portion so that the Josephson currents of the Josephson junctions are respectively coupled in anti-phase and connected in series. The Josephson junction is formed by laminating a lower electrode, a barrier layer of dielectric or inductive material, and an upper electrode. According to this embodiment, the trilayer laminated film comprising a lower electrode, a barrier layer and an upper electrode can be etched using a photo process so that the first and second barrier layers are cut off. As a result, the coupling portion is formed. Therefore, a non-linear characteristic element can be realized if the element's construction is determined by adopting the leakage current for the normal conductance. Even if the manufacturing process permits some leakage current to remain at the junction, the advantage may not be lost. In addition, oscillation becomes easier since the heights of the junctions become even and the coupling between the junctions is stronger. It is preferable that a reflecting wall of a superconductor or a Josephson junction is provided around the two Josephson junctions including a coupling portion. According to this embodiment, the anti-phase coupling becomes stronger, and the non-linear characteristic becomes even greater even if the gap interval is the same. Therefore, an oscillation output of greater amplitude is realized, because the reflecting wall with superconductivity has a shielding effect. Therefore, the wall aids a superconducting current flowing in every barrier layer to couple with magnetic flux to an adjacent junction. The wall also aids an electromagnetic wave to be reflected by a reflecting wall, to enter another junction for coupling. The electromagnetic wave is caused by a Josephson oscillation irradiated from the barrier layers of the junctions. Especially, if the reflecting wall comprises the Josephson junctions, the wall can be formed when the coupling portion is formed during the etching process of the trilayer laminated film comprising the lower and upper electrodes and also the barrier layer on the first and second junctions. The etching is conducted using a photo process.

It is preferable that two superconducting electrodes on the same side are connected across a junction part of the two Josephson junctions in order that the Josephson currents of the Josephson junctions are coupled in anti-phase and connected in series. According to this embodiment, a simple method for manufacturing a plane-structural weak link element can be used. A photo process is mainly applied. Also in this case, a shield film of a superconductor is provided across the dielectric, surrounding the two Josephson junctions including the coupling portion. According to this preferable embodiment, the anti-phase coupling between the junctions becomes stronger and the non-linear characteristic also becomes greater.

It is preferable that two weak link-type Josephson junctions are formed across a coupling portion and then two superconducting electrodes on the same side across the coupling portion are connected, then the Josephson currents of the Josephson junctions are coupled in anti-phase and connected in series. According to this embodiment, the manufacturing will be easier since the structure is planar. In this case, it is preferable that a reflecting wall of a superconductor is provided across the dielectric to at least one of the group consisting of the lower surface, upper surface and side of the two weak link-type Josephson junctions including a coupling portion. According to this embodiment, the coupling between the junctions becomes stronger, and the oscillation output and shield effect will be improved.

It is preferable that at least one selected from the group consisting of an external capacitor and an external resistance is connected to at least one Josephson junction electrically in parallel. According to this embodiment, the time constant of the filter circuit of the Josephson junction current becomes variable, so the voltage-current characteristic of the element can be trimmed.

It is preferable that the material of at least one of the superconducting electrodes composing the Josephson junctions is an oxide superconductor. According to this embodiment, a high critical temperature and a high $I_c R_n$ product can be used, where Rn means the normal resistance of the junction. As a result, the operation can be conducted at a temperature which is lower or equal to a liquid nitrogen temperature (77.3 Kelvin), and an oscillator with a high output and a high frequency purity will be realized.

Though the oscillator of this invention seems to be similar to a conventional oscillator using a negative resistance element, the operation principles are substantially different. The conventional oscillator using a negative resistance element is constructed to compensate the resonance circuit conductance including the load circuit with a negative resistance value of the element. Thus the resonance circuit keeps its oscillation as a pure reactance circuit. On the other hand, the oscillator of this invention is constructed based on the following principle: the degree of freedom of the oscillator is made to be two or more by strongly coupling plural non-linear Josephson oscillators and having them interfere with each other, and separating the voltage between the terminals and the Josephson oscillation current of the junction with a minimum critical current value so that an oscillator with a large amplitude and a pure frequency is provided. Especially in the competing oscillation state between the strong-linked junctions, Josephson currents of dynamic and large non-linear amplitude oscillation flow. Therefore, the oscillation operation with a large amplitude is available. While a conventional oscillator with a negative resistance element can function only in a negative resistance area, the superconducting oscillator of this invention also oscillates outside of the false negative resistance area. Therefore, the operation and the principle of this invention are absolutely different from those of the conventional technique.

DETAILED EXPLANATION OF THE INVENTION

This invention will be explained in detail referring to the following Examples.

EXAMPLE 1

Figure 1:
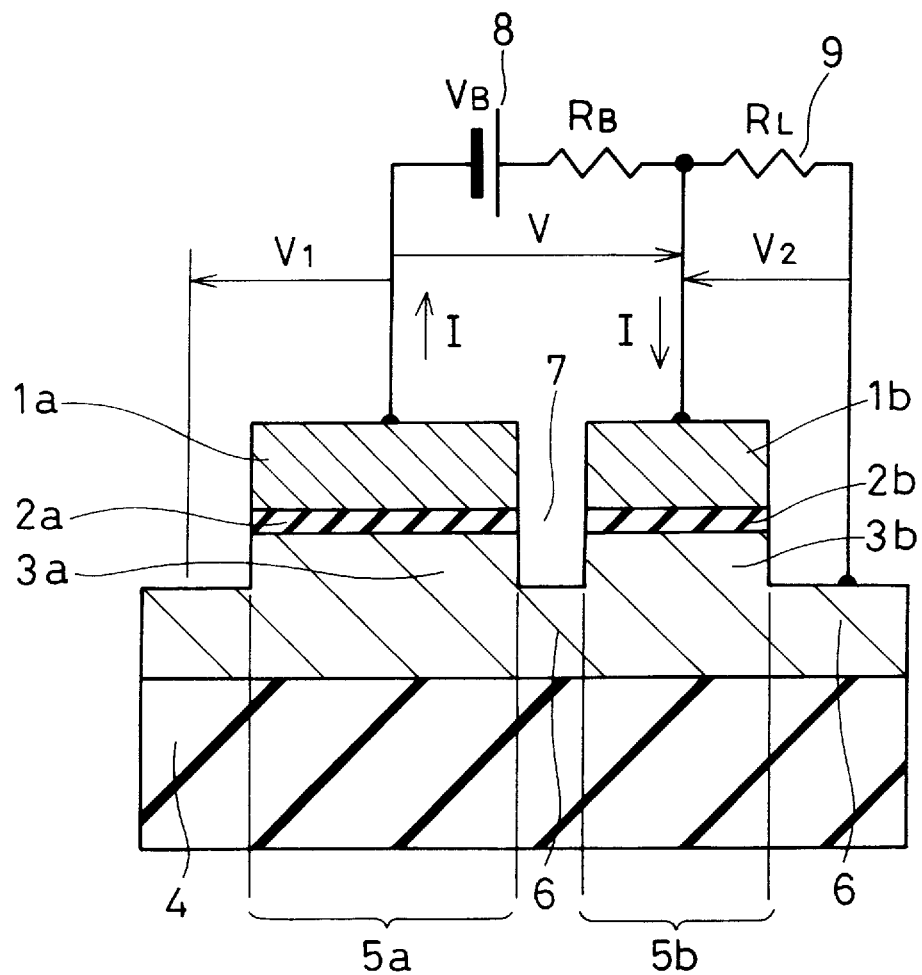
FIG. 1 is a cross-sectional view of the super conducting junction device according to Example 1 of this invention.

FIG. 1 is a cross-sectional view of a superconducting junction device of Example 1. A first junction (Josephson junction) 5a and a second junction (Josephson junction) 5b are disposed on a substrate 4 across a coupling portion 7. The first junction comprises a first upper electrode 1a, a first barrier layer 2a and a first lower electrode 3a. The second junction comprises a second upper electrode 1b, a second barrier layer 2b and a second lower electrode 3b. The first lower electrode 3a and the second lower electrode 3b are connected in series via a connecting electrode 6. The upper electrodes (1a, 1b) and the lower electrodes (3a, 3b) are superconductors, and the barrier layers (2a, 2b) are formed from the materials selected from the group consisting of insulators, semiconductors, normal conductors and superconductors. The coupling portion 7 is a dielectric. The dielectric, of course, includes vacuum and gas etc., as well as solids and liquids. According to this embodiment, it is possible to run currents between the first upper electrode 1a and the second upper electrode 1b and a voltage which is produced between the two upper electrodes 1a and 1b, at the first junction 5a, or the second junction 5b, has a non-linear characteristic.

It is preferable that the width of the coupling portion 7 is at most 10 μm, so strong coupling of the Josephson junctions is maintained.

In Example 1, the junction electrode 6 is made of the same superconducting material as the lower electrodes (3a, 3b), but the material is not limited to this. Other materials can be combined, and normal conductive material may also be used. In this aspect, this invention is different from the working principle of the conventional technique.

The method of manufacturing a superconducting junction with the above construction will now be described.

Oxide materials such as magnesium oxide, strontium titanate or lanthanum aluminate etc. are used for the substrate 4 on which an oxide superconducting film is formed. However, the material for the substrate 4 is not limited to the above-identified materials. Any material can be used if it has a lattice that can be matched to the superconducting thin film and also dispersion from the substrate does not reduce the superconductivity of the film.

First, oxide superconducting materials like YBCO-based superconducting material or Bi-based superconducting material are deposited on the substrate 4 using methods such as sputtering or molecular beam epitaxy, and the lower electrodes (3a, 3b) and the connecting electrode 6 are simultaneously formed to be 50–300 nm thick. Next, to obtain a clean surface, the barrier layers (2a, 2b) are formed to be 1–20 nm without breaking the vacuum state. Insulators like magnesium oxide, strontium titanate or lanthanum aluminate, or superconducting materials with lower critical temperature like YBCO-based or Bi-based superconductor are suitable for the barrier layers (2a, 2b). For instance, $Bi_1Sr_2Cu_1O_x$ is a superconducting phase with a transition temperature of about 12 Kelvin, so it works as a normal conductor at the liquid nitrogen temperature of 77.3 Kelvin. YBCO-based or Bi-based superconducting materials are preferable since the superconducting transition temperature can be changed by adding magnetic elements like Fe or Nd. Next, superconducting thin films 20–200 nm thick that will become the upper electrodes (1a, 1b) are formed on the barrier layers (2a, 2b). The superconducting thin film is composed of materials that are almost the same as those of the lower electrodes. The superconducting transition temperature of the YBCO-based or the Bi-based materials are 80–110 Kelvin. The trilayer laminated film is etched using a photo process in order that the barrier layers 2a and 2b are sectioned and then formed by scribing around them to be the shape of the coupling portion 7. Therefore, a superconducting connecting element with the above characteristic can be manufactured.

According to the embodiment of this invention, a non-linear characteristic element can be realized even if some leakage currents remain in the junctions during the manufacturing process. For this purpose, the element is constructed introducing the leakage currents as the normal conductance. This is an advantage of this invention, which cannot be seen in an element having tunnel superconductor-insulator-superconductor (SIS) Josephson junction characteristic or a conventional non-linear characteristic element which needs a perfect junction interface. The size of a superconducting junction of this invention is as follows. The inner size of the substrate of the first junction 5a is 10 μm×10 μm, the inner size of the substrate of the second junction 5b is 10 μm×5 μm, and the length of the facing sides of junctions (5a, 5b) is 10 μm. The width of the coupling portion 7 between the junctions 5a and 5b line is the range of about 0.1 to 10 μm. The width of the coupling portion 7 is one of the important parameters to determine the non-linear characteristic of the superconducting junction device. The minimum width of 0.1 μm can be altered to suit the reduction of the fabrication process. In theory, it can be miniaturized to the size of one atom.

Figure 2:
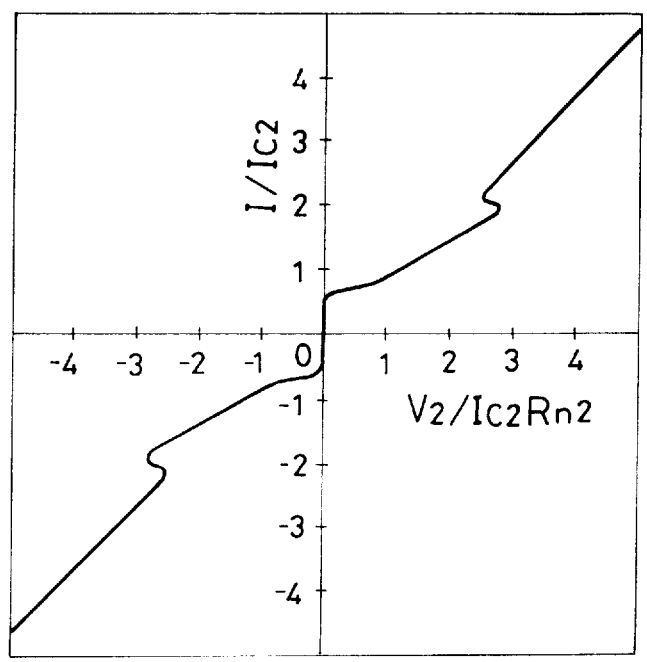
FIG. 2 is a graph to indicate one example of the current-voltage characteristic of the second junction in an embodiment of the superconducting junction device of this invention.

The superconducting junction device is connected as shown in FIG. 1 to measure its voltage-current characteristic. FIG. 2 shows the result. The measurement was carried out at 4.2 Kelvin to simplify the experiment. $Bi_2Sr_2Ca_1Cu_2O_x$ was used for the superconducting thin film material. $Bi_2Sr_2Cu_1O_x$ was used for the barrier layers (2a, 2b) with the thickness of 50 nm. The inner size of the substrate surface of the first junction (5a) is 10 μm×10 μm, the inner size of the substrate surface of the second junction (5b) is 10 μm×5 μm, and the gap (the width of the coupling portion 7) between the junctions 5a and 5b is 2 μm. The critical current of the junctions 5a and 5b are 1 mA and 0.5 mA respectively, and the normal conductive resistances are 1.0 Ω and 2.2 Ω. A constant current source is used for a power source 8. Measurement was carried out connecting 10 kΩ for the load resistance ($R_L$) 9. In FIG. 2, the axis of the abscissa indicates the value of the junction voltage $V_2$ of the junction 5b. The value is standardized by the product of the critical current $I^{c2}$ of the junction 5b and the normal conductive resistance $R_{n2}$. The axis of the ordinate indicates the value of applied current I standardized by the critical current $I_{c2}$ of the second junction 5b. As shown in FIG. 2, strong non-linear characteristic appears in the junction voltage $V_2$ of the second junction 5b at around the bias current where the first junction 5a (with the greater critical current) moves from the zero-voltage state to voltage state.

Figure 3:
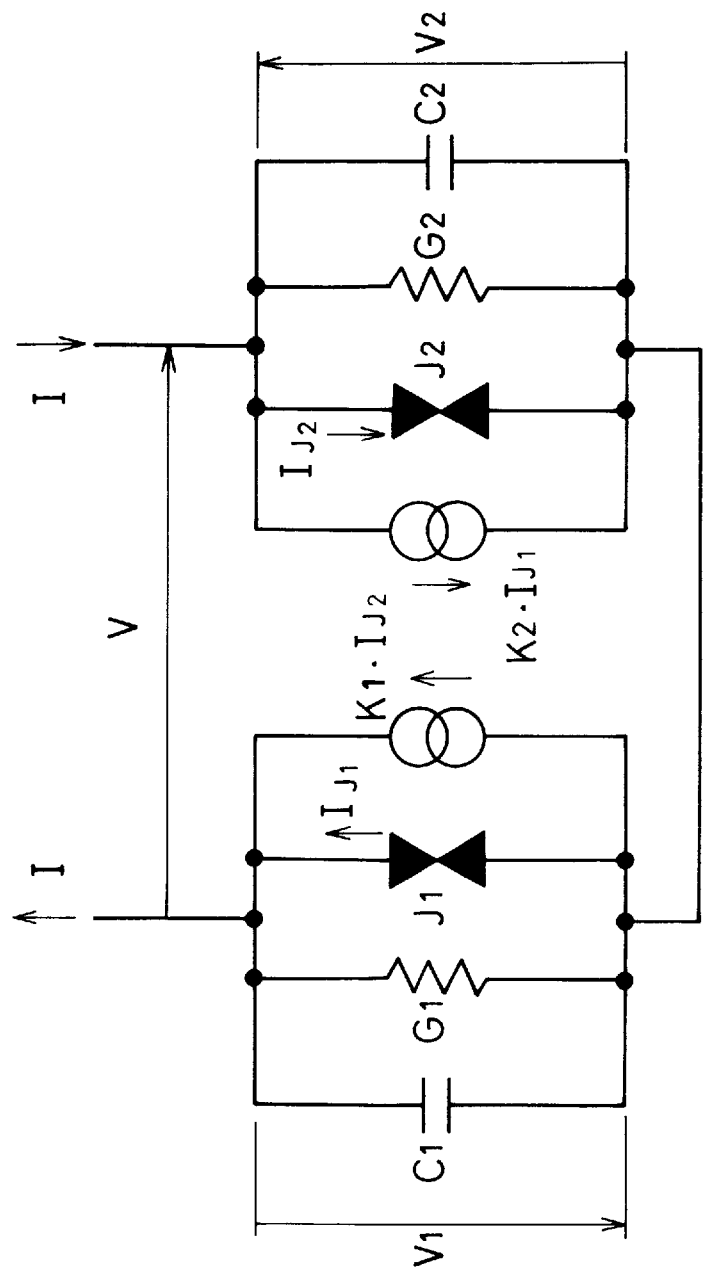
FIG. 3 is a diagrammatic view of an equivalent circuit using resistively shunted junction (RSJ) model with which the operation of one embodiment of the superconducting junction of this invention is explained.

This phenomenon is studied below referring to resistively shunted junction model (cf. "PHYSICS AND APPLICATIONS OF THE JOSEPHSON EFFECT", pages 112–149). The equivalent circuit of the Josephson junction in the RSJ model is indicated as a sine function with a phase difference $\phi_1$ for the first junction $J_1$. The circuit can be indicated by the Josephson current $I_{J1}$, conductance $G_1$ (inverse of the normal conductive resistance) and (junction) capacitance $C_1$ as shown in FIG. 3. The Josephson current $I_{J1}$ oscillates with frequency in proportion to the junction voltage $V_1$ when phase slip occurs. The conductance $G_1$ runs normal conducting current in parallel to the Josephson current. The capacitance $C_1$ enters the junction in parallel. The second junction has the same construction. The two junctions are connected in series. FIG. 1 shows that the Josephson current is coupled either magnetically or electromagnetically to the adjacent Josephson junction. The Josephson oscillation is irradiated from the Josephson junction. When the coupling coefficient is represented as $k_1$, the coupled current of $k_1 \cdot I_{J2}$ flows in the Josephson junction circuit in parallel. FIG. 3 is the equivalent circuit of the superconducting junction device obtained in this way. Hereinafter, it will be called "anti-phase coupling" when the coupling coefficients ($k_1$, $k_2$) are negative. The anti-phase is shown in FIG. 1. The equation representing the time dependence of this circuit is given below.

$$\frac{d\phi_1}{2\theta} = \gamma \cdot V_{1n} \quad (1)$$

$$\frac{d\phi_2}{d\theta} = V_{2n} \quad (2)$$

$$\frac{dV_{1n}}{d\theta} = \frac{I_n/\alpha - V_{1n} - \sin(\phi_1) - k_1 \cdot \sin(\phi_2)}{\beta \cdot \delta} \quad (3)$$

$$\frac{dV_{2n}}{d\theta} = \frac{I_n - V_{2n} - \sin(\phi_2) - k_2 \cdot \sin(\phi_1)}{\beta} , \quad (4)$$

wherein $t$ is time and $$\theta = \frac{2e}{h/2\pi}(I_{c2}/G_2)t, \ \alpha = I_{c1}/I_{c2}(\geq 1),$$

$$\beta = \frac{2e}{h/2\pi}(I_{c2}/G_2)(C_2/G_2), \ \gamma = (I_{c1} \cdot G_2/I_{c2} \cdot G_1),$$

$$\delta = (C_1 \cdot G_2)/(C_2 \cdot G_1), \ I_n = I/I_{c2},$$

$$V_{1n} = V_1(G_1 \cdot I_{c1}), \ V_{2n} = V_2(G_2 \cdot I_{c2})$$

However, the above formulae are non-linear differential equation including a transcendental function, so it is difficult to obtain a general solution. The inventors conducted a numerical calculation in detail and found the following: a large non-linear characteristic is generated in the $V_{2n}$–$I_n$ characteristic in case of anti-phase, and especially, the non-linear characteristic becomes greater as the absolute value of the coupling coefficient approaches to one, and a negative resistance appears as shown in FIG. 2. It was also found that these non-linear characteristics are seen at the current $I_{c1}$ where the first Josephson junction having a greater critical current, moves from zero-voltage state to voltage state. When elements are manufactured by forming two Josephson junctions having similar characteristics of critical current value etc. (e.g., the junction areas are equal to each other in FIG. 1), the non-linear characteristics are not remarkable. This result corresponds to a simulation case where a $\alpha=\gamma=\delta=1$. In this case, a pure resistance is also seen. The result of the simulation corresponds well to the experimental results. The inventors refer to this result, and explain the operating principle of the superconducting junction as follows.

Two Josephson junctions having different critical current values are coupled so that the alternating Josephson currents flowing each junction become anti-phase. Then the Josephson junctions receive bias modulation at anti-phase by the other's Josephson current. When I<$I_{cp2}$ ($I_{c2}$<$I_{c1}$), current running in both of the junctions is less than the critical current value. Therefore, a zero-voltage state is retained and $V_2=0$. When $I_{cp2}$<I<$I_{cp1}$ (<$I_{c1}$), current having a value less than the critical current voltage flows in and zero-voltage state continues. Therefore, oscillation current reflecting the second Josephson junction current $I_{j2}$ flows to the first Josephson current $I_{j1}$. The current $I_{j2}$ is coupled in anti-phase. Oscillation current flowing in the first Josephson junction is coupled in anti-phase to the second Josephson junction current $I_{j2}$, so the first Josephson junction current $I_{j1}$ is partially added to (positively fed back). Therefore, the oscillation current flowing in the second Josephson junction current $I_{j2}$ becomes greater compared to the case where no coupling occurs ($k_1=k_2=0$). As a result, voltage $V_2$ generated at the second Josephson junction becomes greater. Therefore, the voltage characteristics of the second Josephson junction is emphasized compared to the case which has no coupling. When $I_{cp1}$<I, the current value flowing in the first Josephson junction exceeds $I_{c1}$, and the phase-difference of the Josephson junctions causes phase slip. Therefore, the condition changes to the voltage state, and oscillation current by the Josephson oscillation mainly flows into the first Josephson junction current $I_{j1}$. This is coupled to the second Josephson current $I_{j2}$ in anti-phase, and a beat oscillation is generated in the second Josephson junction current $I_{j2}$. This oscillation current $I_{j2}$ oscillates at a frequency which is dependent on the Josephson junction voltage $V_2$, so the frequency shows a non-linear beat oscillation. $I_{j2}$ is filtered by a time constant circuit comprising a junction capacitance and a normal conductance, and becomes Josephson junction voltage $V_2$. In this case, the positive feedback effect of $I_{j2}$ via $I_{j1}$ is controlled because the non-linear beat oscillates at random. $V_2$ becomes smaller compared to the other case where $I_{cp2}$<$I_{cp1}$. The characteristic variation of $V_2$ remarkably occurs when $I_{cp1}$ and I are almost the same. Therefore, when the first Josephson junction first Josephson current $I_{j1}$. The current $I_{j2}$ is coupled in anti-phase. Oscillation current flowing in the first Josephson junction is coupled in anti-phase to the second Josephson junction current $I_{j2}$, so the first Josephson junction current $I_{j1}$ is partially added to (positively fed back). Therefore, the oscillation current flowing in the second Josephson junction current $I_{j2}$ becomes greater compared to the case where no coupling occurs ($k_1=k_2=0$). As a result, voltage $V_2$ generated at the second Josephson junction becomes greater. Therefore, the voltage characteristics of the second Josephson junction is emphasized compared to the case which has no coupling. When $I_{cp1}$<I, the current value flowing in the first Josephson junction exceeds $I_{c1}$, and the phase-difference of the Josephson junctions causes phase slip. Therefore, the condition changes to the voltage state, and oscillation current by the Josephson oscillation mainly flows into the first Josephson junction current $I_{j1}$. This is coupled to the second Josephson current $I_{j2}$ in anti-phase, and a beat oscillation is generated in the second Josephson junction current $I_{j2}$. This oscillation current $I_{j2}$ oscillates at a frequency which is dependent on the Josephson junction voltage $V_2$, so the frequency shows a non-linear beat oscillation. $I_{j2}$ is filtered by a time constant circuit comprising a junction capacitance and a normal conductance, and becomes Josephson junction voltage $V_2$. In this case, the positive feedback effect of $I_{j2}$ via $I_{j1}$ is controlled because the non-linear beat oscillates at random. $V_2$ becomes smaller compared to the other case where $I_{cp2}$<$I_{cp1}$. The characteristic variation of $V_2$ remarkably occurs when $I_{cp1}$ and I are almost the same. Therefore, when the first Josephson junction changes from the zero-voltage state to the voltage state, the second Josephson junction current quickly decreases, and a negative resistance area is generated. If the anti-phase coupling becomes weak, the negative resistance area is lost. However, the above-mentioned non-linear characteristic on the voltage-current curve is maintained. As a result, superconducting junction devices with negative resistance can be provided constantly, using a weak link-type Josephson junction having greater normal conductance instead of a tunnel Josephson junction which is not easily manufactured.

Figure 4:
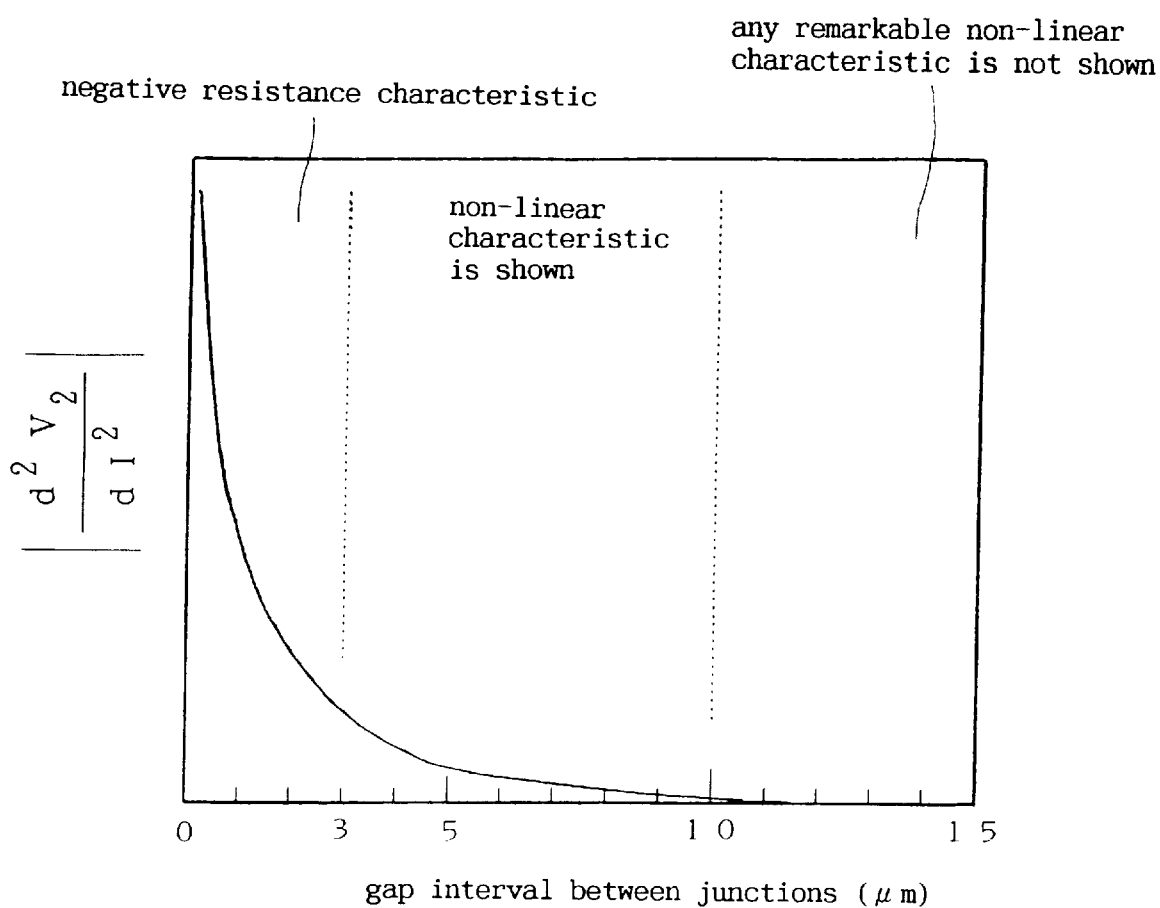
FIG. 4 is a graph to show the non-linear characteristic dependency on the gap interval between the junctions in one embodiment of the superconducting junction of this invention.

The operational principle of this invention is briefly explained in above paragraphs. It may be clear from the explanation that the degree of coupling is one of the important parameters. FIG. 4 shows the gap interval dependency between the non-linear junctions in the superconducting junction devices having the construction of FIG. 1. FIG. 4 indicates a case where a $\alpha=2$. The ordinate shows the rate of change of differential resistance when the value of the applied current of the voltage-current curve of the second junction (having a smaller critical current value) is similar to that of the first junction. The greater value means a greater non-linear characteristic. As shown in FIG. 4, anti-phase coupling should be found up to the gap interval to satisfying the phase relation, however, about 10 μm can be seen in experiments. A gap interval over 10 μm does not make a remarkable difference compared to a case without coupling. Therefore, a gap interval of at most 10 μm is a practical coupling distance. When the gap interval becomes narrower, the non-linear characteristic becomes greater. Especially, a negative resistance area appears when the gap interval is 3 μm or less.

Figure 5:
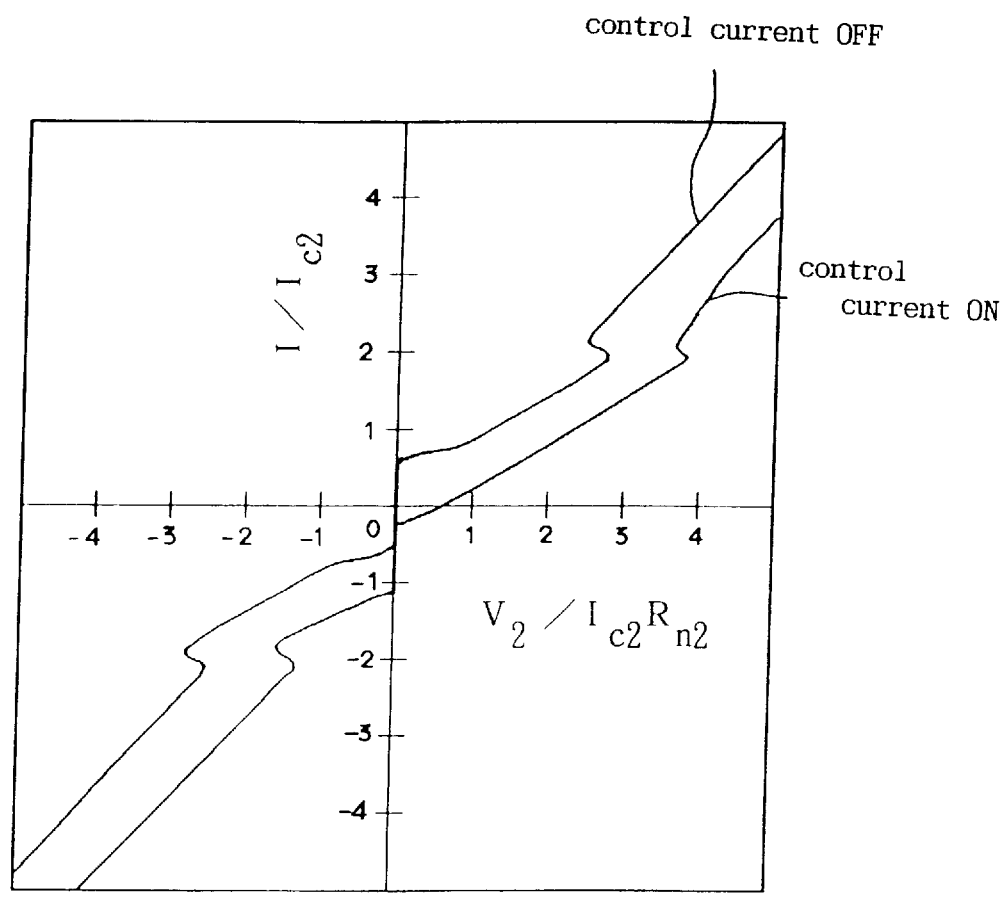
FIG. 5 is a graph to show one example of the current-voltage characteristic when control current is applied to the second junction in one embodiment of the superconducting junction of this invention.

In addition, the junction electrode 6 (lower electrode 3) of FIG. 1 is regarded as a control electrode, and control current is run between the control electrode and the second upper electrode 1b. FIG. 5 indicates one example of the voltage-current characteristic of such a case. FIG. 5 illustrates the case where a control current of $|I_{c2}|$ is run. The control circuit where the current flows runs from the junction electrode 6 to the upper electrode 1b through the second lower electrode 3b. It is clear from the comparison with FIG. 2 that the voltage-current curve can be controlled by the control current. Thus, the superconducting junction device can also be used for a three-terminal element. In other words, the superconducting junction device of this invention can be used as a switching element, an amplication-oscillation element and a three-terminal element etc.

This invention can be used for various elements in addition to the superconducting junction device described in Example 1.

EXAMPLE 2

Figure 6:
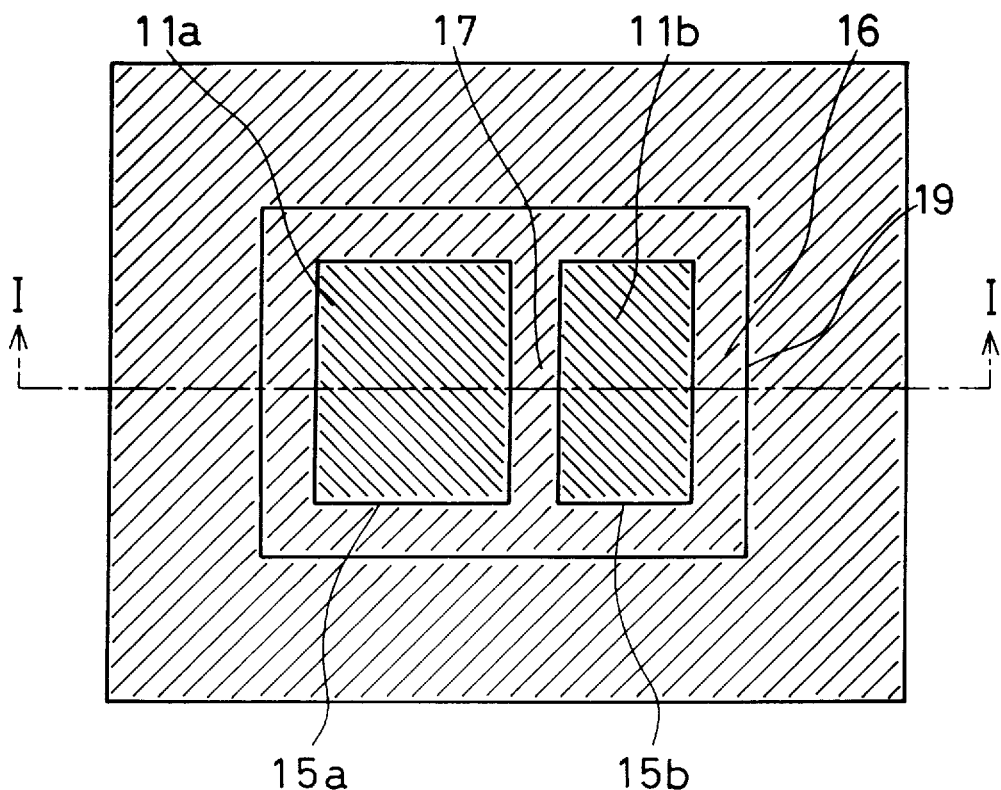
FIG. 6 is a plan view of the superconducting junction of Example 2 of this invention.
Figure 7:
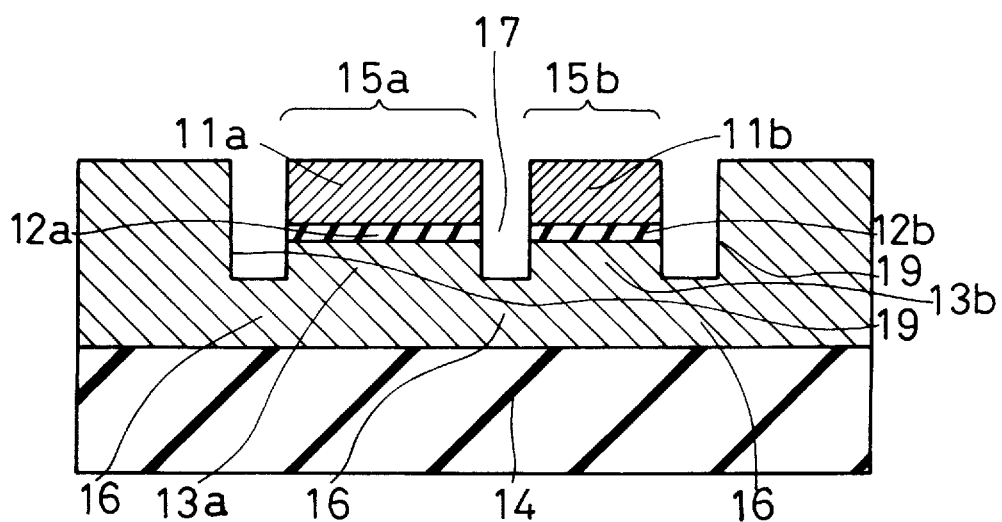
FIG. 7 is a cross-sectional view along line I—I of FIG. 6.

FIG. 6 is a plan view of the superconducting junction device of Example 2 of this invention. FIG. 7 is the cross-sectional view along line I—I of FIG. 6. As shown in FIGS. 6 and 7, a first junction (Josephson junction) 15a and a second junction (Josephson junction) 15b are disposed on a substrate 14, separated by a coupling portion 17. The first junction comprises a first upper electrode 11a, a first barrier layer 12a and a first lower electrode 13a. The second junction comprises a second upper electrode 11b, a second barrier layer 12b and a second lower electrode 13b. The first lower electrode 13a and the second lower electrode 13b are connected in series via a connecting electrode 16. The coupling portion 17 is a dielectric. This embodiment provides a construction where currents which flow in the two Josephson junctions are coupled in anti-phase. Around the two Josephson junctions including the coupling portion 17 (the first and second junctions 15a, 15b), a reflecting wall 19 is provided. The reflecting wall 19 comprises a superconductor connected by the connecting electrode 16. The top of reflecting wall 19 should surround the barrier layers (12a, 12b) of the junctions (15a, 15b). In other words, the upper surface should be positioned higher than the barrier layers (12a, 12b). The reflecting wall 19 comprising a superconductor has a shield effect because of its superconductivity. Thus the wall 19 functions to help the superconducting current flowing in the barrier layers (12a, 12b) to couple to adjacent junctions in magnetic flux. It helps the Josephson oscillation from the barrier layers (12a, 12b) to be reflected by the wall 19, enter and couple with the other junction. Therefore, according to the embodiment, the anti-phase coupling becomes stronger than in Example 1, and a greater non-linear characteristic is realized, even if the gap between the junctions is the same.

EXAMPLE 3

Figure 8:
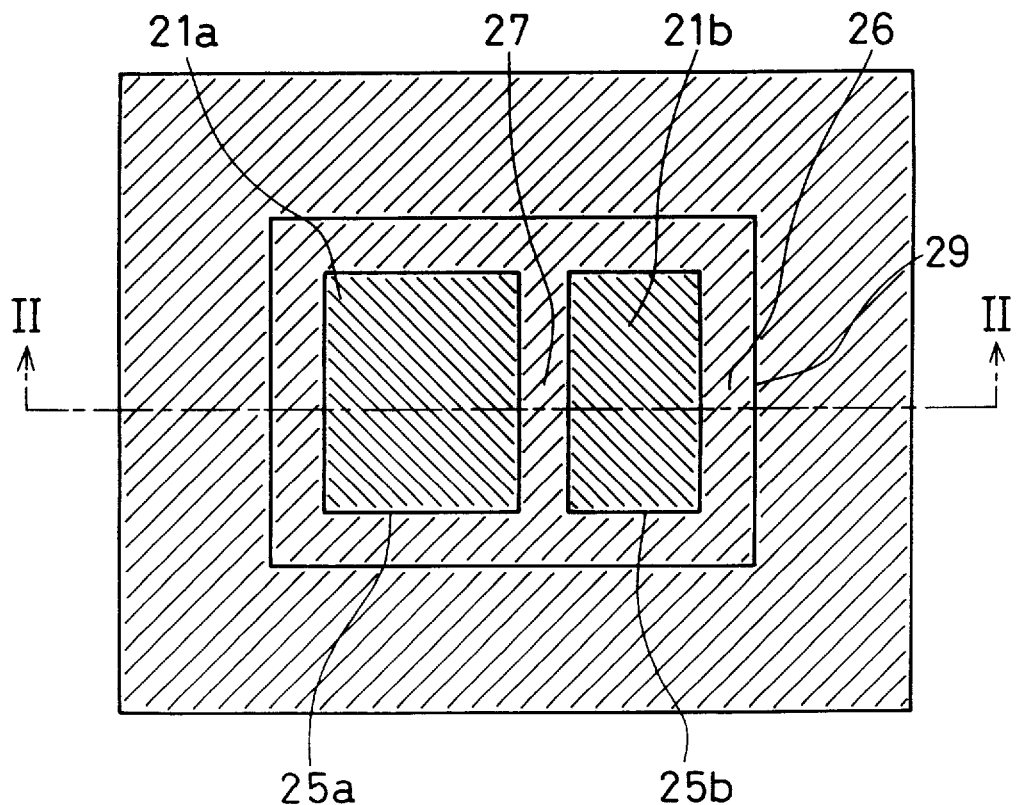
FIG. 8 is a plan view of the superconducting junction of Example 3 of this invention.
Figure 9:
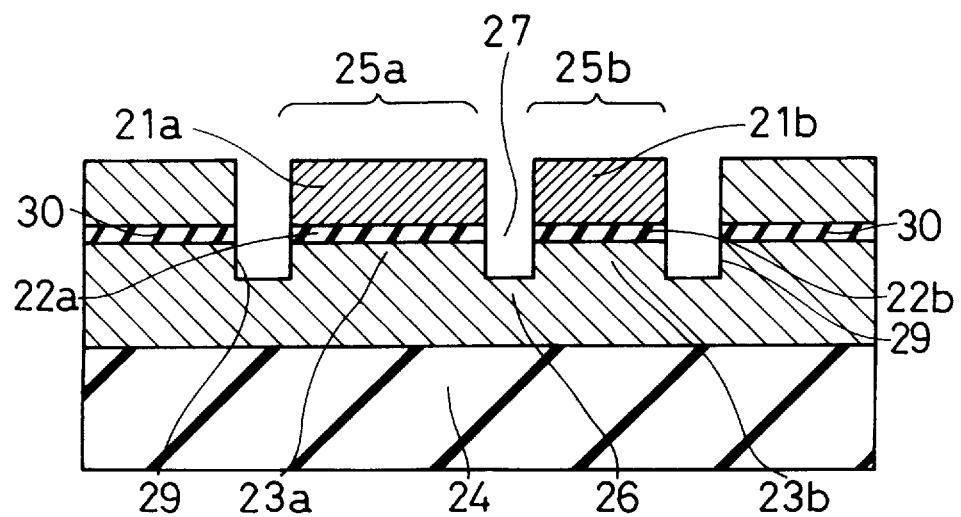
FIG. 9 is a cross-sectional view along line II—II of FIG. 8.

FIG. 8 is a plan view to show the superconducting junction of EXAMPLE 3 of this invention. FIG. 9 is the cross-sectional view along line II—II of FIG. 8. As shown in FIGS. 8 and 9, a first junction (Josephson junction) 25a and a second junction (Josephson junction) 25b are disposed on a substrate 24 across a coupling portion 27. The first junction comprises a first upper electrode 21a, a first barrier layer 22a and a first lower electrode 23a. The second junction comprises a second upper electrode 21b, a second barrier layer 22b and a second lower electrode 23b. The first lower electrode 23a and the second lower electrode 23b are connected in series via a connecting electrode 26. A reflecting wall 29 is provided around the two Josephson junctions including the coupling portion 27 (the first and second junctions 25a, 25b). This construction differs from that shown in FIGS. 6 and 7 in that the reflecting wall 29 comprises a junction part 30. The junction part 30 is used in a non-bias condition, so it remains superconducting. The coupling-magnetic field or radiating-electromagnetic field penetrates into the junction 30 deeper than the penetration depth of the superconductor. However, if the width of the junction part 30 of the reflecting wall 29 around the junctions (25a, 25b) is wider than the depth, the wall functions as the reflecting wall as in the wall of Example 2. According to this embodiment, a trilayer laminated thin film is formed by etching the junctions (25a, 25b) by a photo process. The thin film comprises the upper and lower superconducting thin film (upper electrodes 21a and 21b, and lower electrodes 23a, 23b) and the barrier layers (22a, 22b) between the electrodes. The reflecting wall 29 and the coupling portion 27 are formed at the same time.

EXAMPLE 4

Figure 10:
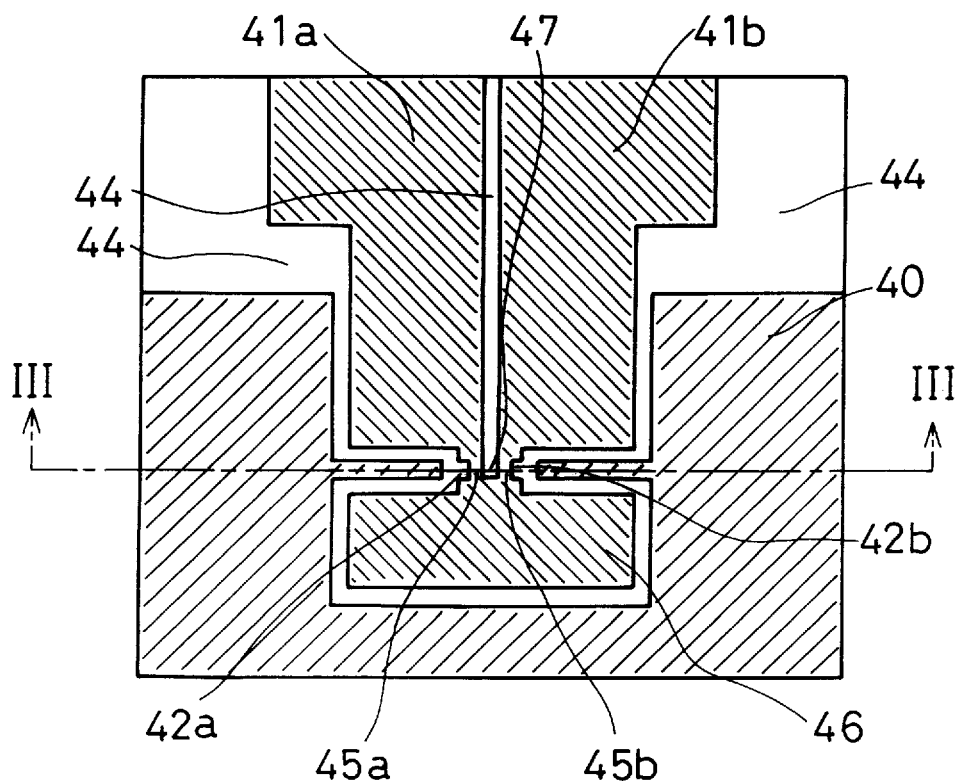
FIG. 10 is a plan view of the superconducting junction of Example 4 of this invention.
Figure 11:
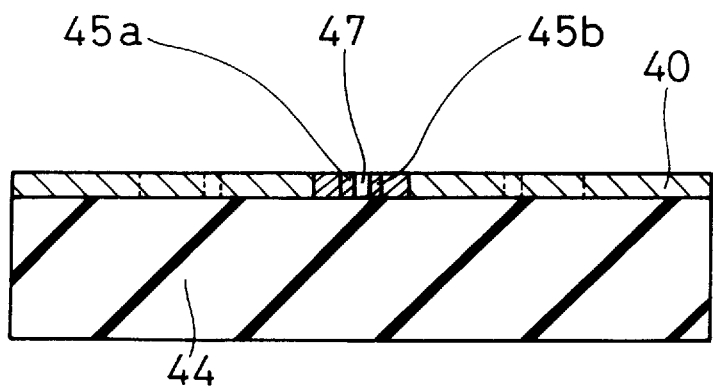
FIG. 11 is a cross-sectional view along line III—III of FIG. 10.

FIG. 10 is a plan view to show the superconducting junction of Example 4 of this invention. FIG. 11 is the cross-sectional view along line III—III of FIG. 10. As shown in FIGS. 10 and 11, a first junction (Josephson junction) 45a and a second junction (Josephson junction) 45b are disposed on a substrate 44 across a coupling portion 47 which is a space (a dielectric). The first junction comprises a first electrode 41a and a first weak link 42a. The second junction comprises a second electrode 41b and a second weak link 42b. The first junction 45a and the second junction 45b are connected in series via a connecting electrode 46. The distance between the first weak link 42a and the second weak link 42b should not be more than 10 μm. The junctions (45a, 45b) are differentiated in the critical current values and connected in series. Anti-phase coupling is realized due to this construction which was coupling via magnetic flux coupling of the adjacent weak links (42a, 42b), or electromagnetic coupling by an electromagnetic wave emitted by the Josephson junction oscillation in the junctions. As a result, a strong non-linear characteristic can be found at the terminal voltage of the junction having the lower critical current value. If the closest distance between the weak links 42a and 42b is more than 10 μm, some non-linear characteristic due to the effect of the anti-phase coupling (see FIG. 4) appears on the voltage between the terminals (between the connecting electrode 46 and the second electrode 41b) of the second junction 45b when the junction 45a, having a larger critical current value, changes from the zero-voltage state to the voltage state. However, it is preferable for practical use that the closest distance between 42a and 42b (the closest distance of the coupling portions) is not more than 10 μm. According to this Example, a manufacturing process for a planar weak link element can be used. Such a weak link element is different from the layered-type superconducting junction device in that it is easily made using a photo process technique.

The first and second weak links (42a, 42b) are not limited to the construction shown in FIG. 10. Other bridges like a Dayem bridge, a variable-thickness bridge which is abbreviated to VTB (cf. "PHYSICS AND APPLICATIONS OF JOSEPHSON EFFECT", page 167), a proximity-effect microbridge, or a step-edge bridge which has a step form can be used.

Though Example 4 describes planar coupling, the fundamental idea is not substantially different from Example 1. Moreover, as shown in FIG. 10, a shield film 40 comprising a superconductor can be formed on the plane of the substrate 44 where junctions 45a and 45b are also formed. Then the anti-phase coupling becomes stronger because of the superconducting shield effect, and the non-linear characteristic will be increased as Examples 2 and 3.

EXAMPLE 5

Figure 12:
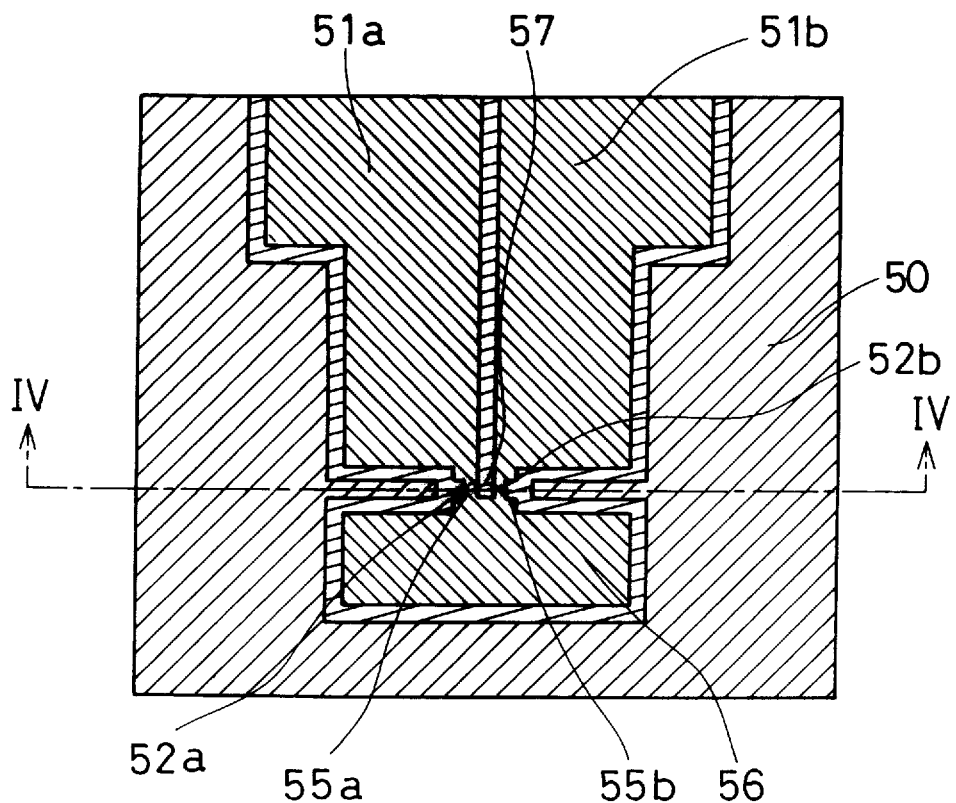
FIG. 12 is a plan cross-sectional view (to show the cross-sectional view along line V—V of FIG. 13) of the superconducting junction of Example 5 of this invention.
Figure 13:
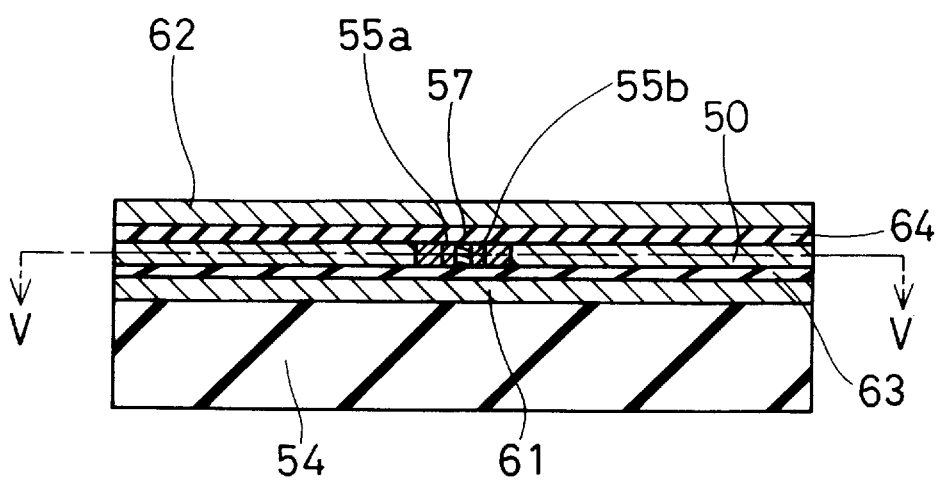
FIG. 13 is a front cross-sectional view (to show the cross-sectional view along line IV—IV of FIG. 12) of the superconducting junction of Example 5 of this invention.

FIG. 12 is a cross-sectional plan view of the superconducting junction device of Example 5 of this invention, and FIG. 13 is the front cross-sectional front view. In other words, FIG. 12 is the cross-sectional view along line V—V of FIG. 13, and FIG. 13 is the cross-sectional view along line IV—IV of FIG. 12. As shown in the drawings, a first junction 55a and a second junction 55b are disposed on the substrate 54 across a coupling portion 57. The first junction 55a comprises a first electrode 51a, a first weak link 52a and a connecting electrode 56. The second junction 55b comprises a second electrode 51b, a second weak link 52b and the junction electrode 56. The first junction 55a and the second junction 55b are coupled in series via the connecting electrode 56. A shield film 50 comprising a superconductor is formed on the substrate 54 where the junctions 45a and 45b are also formed. The construction differs from that of Example 4 shown in FIGS. 10 and 11. According to this embodiment, a lower shield film 61 is disposed between the substrate 54 and the superconducting junction devices (55a and 55b) and an insulating film 63 is sandwiched between the lower shield film 62 and the junctions 55a and 55b. An upper shield film 62 is disposed on the top of the superconducting junction devices and an insulating film 64 which is sandwiched between the upper film 62 and the junctions 55a and 55b. The coupling portion 57 of this example is filled with a solid dielectric material. According to this embodiment, anti-phase coupling which is greater than that of Example 4 (FIGS. 10, 11) is realized between the junctions due to the shield effect of the films 61 and 62. Therefore, a greater non-linear characteristic can be realized either of the shield films may be eliminated, though anti-phase coupling will be sacrificed to some degree.

The characteristics of the devices shown in Examples 2–5 are the same as those shown in FIGS. 2–4, so non-linearities like negative resistance characteristic will be provided. If an external capacitor or an external resistance is connected to each of the Josephson junctions, the time constant of the filter circuit of the Josephson junction current can be changed, and the voltage-current characteristic of the element can be trimmed.

The superconducting oscillator of this invention solves some problems of non-linear oscillation of the Josephson junctions which use the basic characteristic of superconductive-condensed state. The problem of the Josephson junction is that a single frequency oscillation output cannot be obtained with greater amplitude because of the low spectrum purity of the oscillation frequency. The inventors have found that such a problem arises because the junction has only one oscillation parameter as an oscillator.

To solve this problem, the inventors increased the oscillation freedom by providing an inner oscillation parameter having independent oscillators. The inventors constructed the oscillator by coupling it to a resonance circuit.

In the superconducting oscillator of this invention, the circuit part to extract the single frequency oscillation power and the Josephson oscillation circuit for supplying the other circuit with oscillation energy are separated from each other and operate independently.

The inventors have prepared a superconducting junction device in which a plurality of Josephson junction having different critical currents are strongly coupling to each other via a coupling portion in different phases. And the electrodes are taken out from both terminals of a Josephson junction having the minimum critical current. In this way, the inventors have made a new internal oscillation parameter. The superconducting junction is constructed by strongly coupling plural Josephson junction devices with different critical current values in different phases via a coupling portion. Therefore, the Josephson oscillation can be generated independently from the oscillation parameter of the resonance circuit (e.g. the current flowing into the resonance circuit, or the voltage between the terminals of the resonance circuit). Referring to this, the inventors have found a method to separate the circuit to extract the single frequency oscillation power and the Josephson oscillation circuit to supply oscillation energy for the other circuit. The method is that a resonance circuit element is connected to the terminals of the Josephson junction having lower critical current value. The average voltage V between the terminals of the Josephson junction is greatest when a bias current flows. The oscillation power at the Josephson frequency ($f=2eV/h=483.8\times V(MHz)$) which corresponds to the voltage becomes greatest. Therefore, the efficiency becomes the best when the oscillation power is combined with the resonance circuit element, and high-frequency oscillation power is extracted. Here, h is Planck's constant, $6.626176\times 10^{-34}$J·s, and V is the voltage in microvolts.

The superconducting junction device is one of the important features of this invention. Plural Josephson junctions of different critical current values are coupled so that the AC Josephson currents of the junctions have different phases due to magnetic flux coupling or electromagnetic coupling. The electromagnetic coupling needs an intermediate electromagnetic wave, and the wave is emitted from each of the Josephson junctions. However, this element has almost the same function as the superconducting junction comprising two Josephson junction devices having different critical currents.

Figure 14:
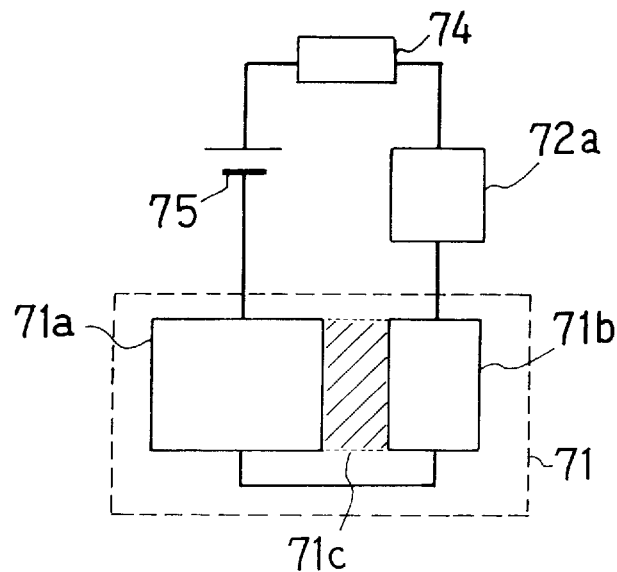
FIG. 14 is a schematic diagram of a superconducting oscillator according to this invention.
Figure 15:
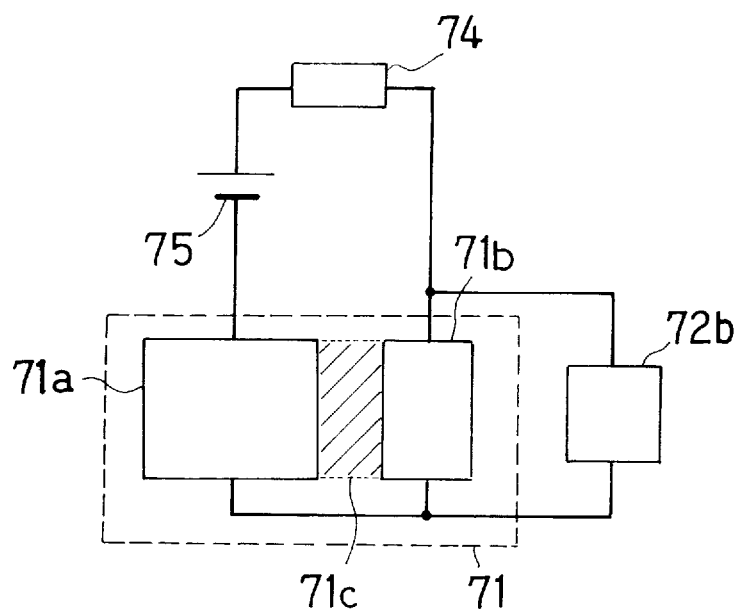
FIG. 15 is a schematic diagram of another superconducting oscillator according to this invention.
Figure 16:
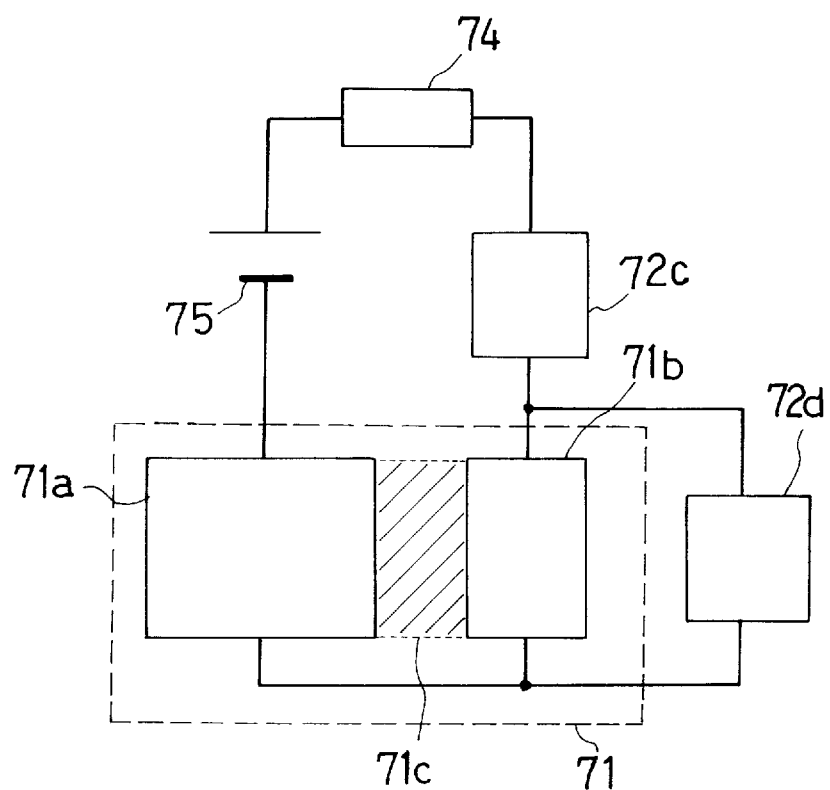
FIG. 16 is a schematic diagram of another superconducting oscillator according to this invention.

FIGS. 14, 15, 16 show a superconducting oscillator of this invention. In FIG. 14, the superconducting junction device 71 is constructed with a first junction 71a and a second junction 71b, Josephson junctions having different critical currents are connected in series, and these junctions (71a, 71b) are coupled in anti-phase via a coupling portion 71c. A resonance circuit element 72a is connected in series to the second junction 71b having the lower critical current. Resistance 74 and power source 75 compose a bias circuit to supply bias current.

In FIG. 15, the superconducting junction device 71 is constructed with a first junction 71a and a second junction 71b, Josephson junctions having different critical currents are connected in series, and these junctions (71a, 71b) are coupled in anti-phase via a coupling portion 71c. FIG. 15 shows that the electrodes of the second junction 71b are taken out, and that the resonance circuit element 72b is connected to the junction 71b in parallel. And bias current is supplied by a bias circuit including a resistance 74 and a power source 75.

In FIG. 16, the superconducting junction device 71 is constructed with a first junction 71a and a second junction 71b, Josephson junctions having different critical currents are connected in series, and these junctions (71a, 71b) are coupled in anti-phase via a coupling portion 71c and the electrodes of the second junction 71b are taken out and the resonance circuit element 72d is connected to the junction 71b in parallel. Resonance circuit element 72c is connected in series to the terminal electrode of the second junction 71b of the superconducting junction device 71. And bias current is supplied by the bias circuit comprising resistance 74 and power source 75.

According to any of the superconducting oscillators shown in FIGS. 14–16, the resonance circuit elements 72a–72d include impedance circuits with capacitive reactances like coils, capacitive reactance, or a reactance having resonance point. For a resonance circuit element, resistance elements connected in series or in parallel are connected to resonance circuits of a coil, or a coil-capacitor's serial and/or parallel circuit.

EXAMPLE 6

Figure 17:
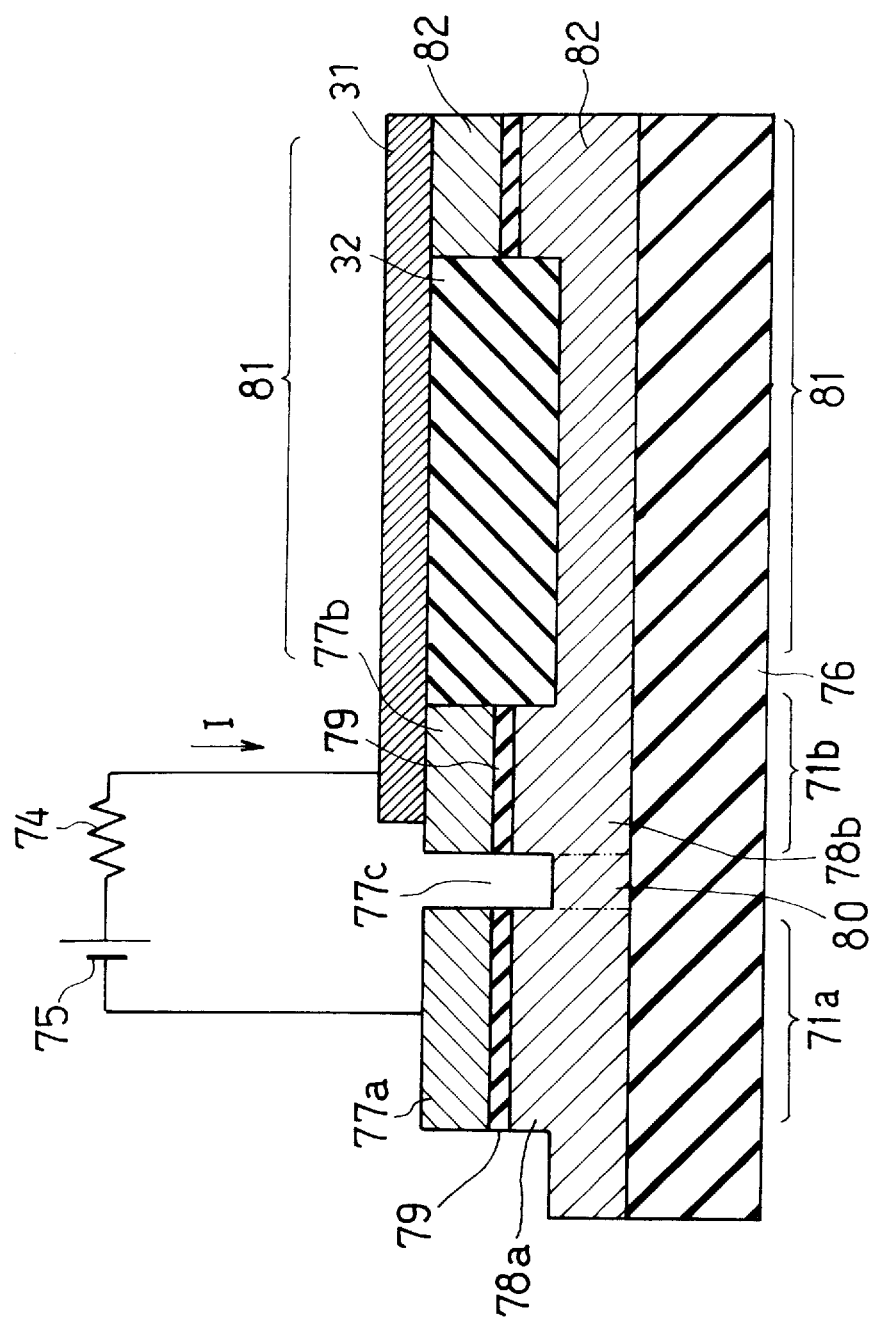
FIG. 17 is a cross-sectional view of a superconducting oscillator according to Example 6 of this invention.

FIG. 17 is a cross-sectional view of a superconducting oscillator according to Example 6. In FIG. 17, first and second lower electrodes (78a, 78b) comprising superconductors are formed on a substrate 76. On the lower electrodes, first and second upper electrodes (77a, 77b) comprising superconductors are formed across a barrier layer 79 comprising an element selected from an insulator, a semiconductor, a normal conductor or a superconductor. In this manner, the first junction (Josephson junction) 71a and the second junction (Josephson junction) 71b are fabricated. The junctions (71a, 71b) are disposed across the coupling portion 77c of dielectric, and connected in series via a connecting electrode 80 of the superconductor. The dielectric here includes vacuum and gas etc. as well as solids or liquids. According to this embodiment, the direction of current flowing in the junctions (71a, 71b) inverts when current I runs between the upper electrodes 77a and 77b via the bias circuit comprising the power source 75 and the resistance 74. As a result, the junctions 71a and 71b are coupled in anti-phase to each other via the coupling portion 77c.

A connecting electrode 82, which uses the same superconductor as the lower electrode 78b, is connected to the second lower electrode 78b. The end part of the connecting electrode 82 and the second upper electrode 77b are connected via a conductor 31 like strip line or meander line. Thus the resonance circuit element 81 is connected to both ends of the second junction 71b in parallel, so that a superconducting resonator is composed. In this figure, 32 is a supporter to support the conductor 31. In this case, the connecting conductor of the resonance circuit element 81 can be formed on a thin film of semiconductor or dielectric formed on the connecting electrode 82. Other constructions like an air bridge are also available.

It is preferable that the width of the coupling portion 77c is not more than 10 μm, so that the coupling between the two Josephson junctions (71a, 71b) becomes stronger.

In this example, the connecting electrode 80 is composed of the same superconductor as the lower electrodes. The composition, however, is not limited to this; a combination of other materials or normal conductive materials may also be used.

EXAMPLE 7

Figure 18A:
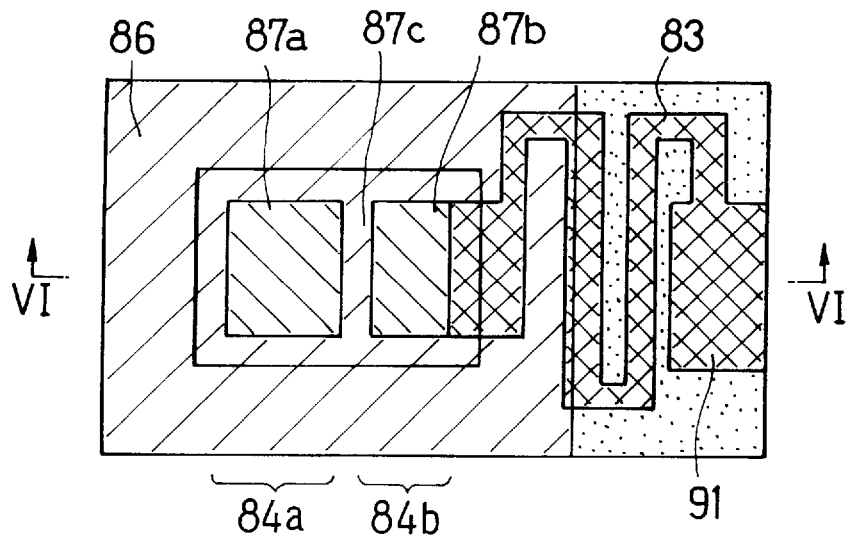
FIG. 18A is a plan view of a superconducting oscillator according to Example 7 of this invention.
Figure 18B:
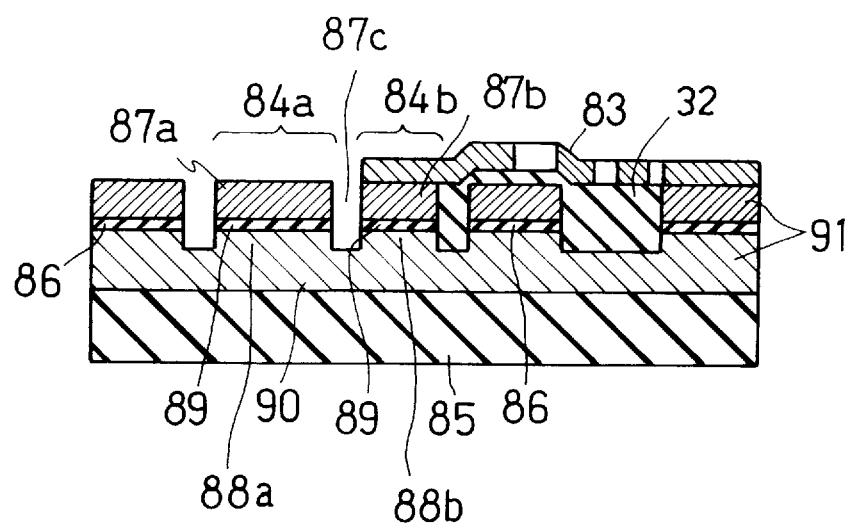
FIG. 18B is the cross-sectional view along line VI—VI of FIG. 18A.

FIG. 18A is a plan view of the superconducting oscillator of Example 7 of this invention, and FIG. 18B is the cross-sectional view along line VI—VI of FIG. 18A. As shown in these drawings, first and second lower electrodes (88a, 88b) of superconductors are formed on the substrate 85. On the lower electrodes, first and second upper electrodes (87a, 87b) of superconductors are formed across a barrier layer 89 comprising an element selected an insulator, a semiconductor, a normal conductor or a superconductor. In this manner, a first junction (Josephson junction) 84a and a second junction (Josephson junction) 84b are formed. The first junction 84a and the second junction 84b are disposed sandwiching a coupling portion 87c made of a dielectric, and the lower electrodes (88a, 88b) are connected in series via a connecting electrode 90 which is made from the same superconductor. Thus a superconducting junction device is formed. Around the element, a reflecting wall 86, comprising a Josephson junction construction of larger lamination area is formed. Another connecting electrode 91 is connected to the second lower electrode 88b, the two electrodes being made of the same superconductor. The end of the connecting electrode 91 and the second upper electrode 87b are connected via an inducting meander line. As a result, a resonance circuit element 83 is connected in parallel across the electrodes of the second junction 84b.

As mentioned above, both junctions are surrounded by the reflecting wall 86 comprising a superconductor which is a strong anti-magnetic material. As a result, the coupling between the first junction 84a and the second junction 84b becomes stronger and greater oscillation power can be obtained. The reflecting wall should be high enough at least to surround the barrier wall 89 of each of the junction (84a, 84b). Namely, the upper surface of the reflecting wall 86 should be located higher than the barrier layer 89. The reflecting wall 86 comprising a superconductor provides a shield effect. Thus, the superconducting current flowing in the barrier layer 89 is coupled in more magnetic flux state to the adjacent junctions. Alternatively, magnetic flux and electromagnetic waves emitted by the barrier layer 89 of Josephson oscillation of the junctions are reflected by the reflecting wall 86, entering the other junction and strengthening the coupling of the junctions. In addition, capacitances $C_1$ and $C_2$ are increased, and diverges the pass of the superconducting current and that of the normal conductive current. Therefore, according to this example, the anti-phase coupling becomes stronger compared to Example 6, and a greater oscillation power can be obtained if the gap interval between the junctions is the same.

The construction of reflecting wall 86 is not necessarily limited to the junction construction of this example, but the wall may also be comprised of a superconducting layer only. When a reflecting wall 86 having junction construction is used, the superconducting state is retained since the junction is used in a non-biased state. A coupling magnetic field and a radiated electromagnetic field penetrate deeper than the superconductor itself, or as deep as the Josephson penetration depth. However, if the width of the junction of the reflecting wall 86 surrounding the junctions exceeds the penetration depth, the junction construction can operate as the reflecting wall. According to the example, the reflecting wall 86 and the junctions (84a, 84b) can be formed simultaneously.

The superconducting oscillators explained in Examples 6 and 7 have constructions in which laminated junctions face each other. The construction is not necessarily limited to that disclosure. A laminated junction may surround another junction, at a predertermined distance, thus maintaining strong coupling between junctions.

EXAMPLE 8

This example refers to a method of preparing a superconducting oscillator, using the laminated superconducting junction device of Examples 6 and 7.

Magnesium oxide, strontium titanate or lanthanum aluminate etc. are used for the material of the substrate 76 or 85, and an oxide superconducting thin layer is formed thereon. The material for the substrate is not limited but any material will be available if it has a lattice which can be matched with the superconducting thin film and superconducting characteristics of the thin film are reduced by diffusion from the substrate.

An oxide superconducting material like YBCO superconducting material or Bi superconducting material is deposited on the substrate, using methods like a sputtering or molecular beam epitaxy method. The lower superconducting thin film of 50–300 nm is formed, which will become the lower electrodes (78a, 78b, 88a, 88b), the connecting electrodes (80, 90), and the connecting electrodes (82, 91). Barrier layers 79 and 89 of 1–20 nm thick are then formed thereon, without breaking vacuum in order to obtain a clean surface. For materials of the barrier layers 79 and 89, insulators like magnesium oxide, strontium titanate or lanthanum aluminate, or superconducting materials having lower critical temperature (e.g. YBCO or Bi) are preferable. For instance, $Bi_1Sr_2Cu_1O_x$ is a superconducting material whose transition temperature is about 12 Kelvin, and thus acts as a normal conductor at the temperature of 77.4 Kelvin of liquid nitrogen. Superconductors like YBCO or Bi superconductors are preferable since the superconducting transition temperatures can be changed by altering the concentration of magnetic elements like Fe and Nd. An upper superconducting thin film of 20–200 nm thick is formed thereon without breaking the vacuum, this upper film becoming the upper electrodes (77a, 87a, 77b, and 87b) and the connecting electrodes (82, 91). The material of this film is the same as the superconducting material for the lower electrodes. The superconducting transition temperature of these YBCO or Bi superconductors is 80–110 Kelvin. This trilayer laminated film is etched using a photo process so that the barrier layers (79, 89) are cut off (e.g. using Ar ion milling) to be the shape of junctions (71a, 71b, 84a, 84b) and the connecting electrodes (82, 91) and/or the reflecting wall 86. Next, insulators like calcium fluoride, magnesium oxide and silicon dioxide, or semiconductor materials like silicon are formed thereon to be a supporter 32, by a mask vapor deposition or a photo process after the thin film deposition. On the supporter 32, resonance circuit elements (81, 83) are pattern-formed using conventional technique in order to be connected between the second upper electrodes (77a, 87a) and the connecting electrodes (82, 91). Therefore, a superconducting oscillator with this construction is formed. According to the embodiment of this invention, a superconducting oscillator can be realized even if some leakage currents are retained in the junctions during the manufacturing process. For this purpose, the element is constructed introducing the leakage currents as the normal conductance. The substrate inner dimension of the first junctions (71a, 84a) is 10 μm×10 μm, the substrate inner dimension of the second junctions (71b, 84b) is 10 μm×5 μm. The length of the opposite sides of the first and second junctions (71a, 84a, 71b and 84b) is 10 μm. And the width of the coupling portion 77c and 87c between the first and second junctions is about 0.1–10 μm. The width of the coupling portion 77c and 87c is one of the important parameters determining the characteristic of the superconducting oscillator.

EXAMPLE 9

Figure 19A:
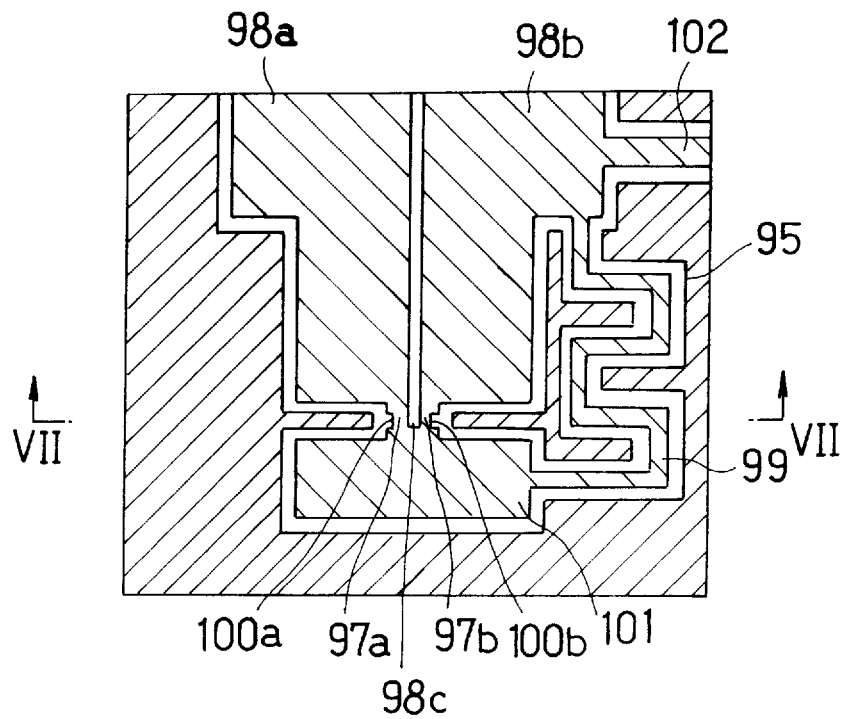
FIG. 19A is a plan view (the cross-sectional view along line VIII—VIII of FIG. 19B) of a superconducting oscillator according to Example 9 of this invention.
Figure 19B:
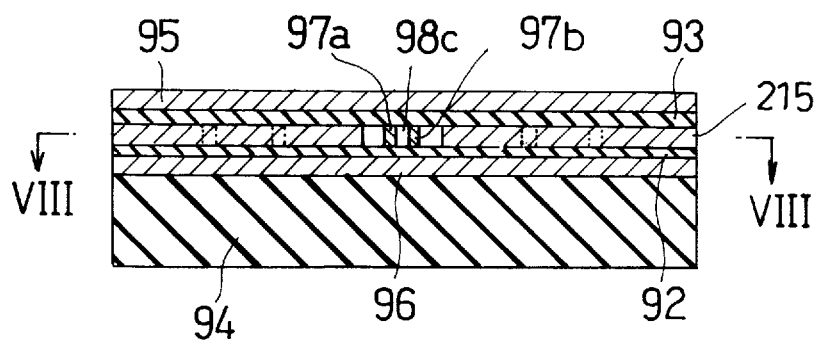
FIG. 19B is the cross-sectional view along line VII—VII of FIG. 19A.

FIG. 19A is a plan view of the superconducting oscillator of Example 9, or the cross-sectional view along line VIII—VIII of FIG. 19B. FIG. 19B is the cross-sectional view along line VII—VII of FIG. 19A.

As shown in FIGS. 19A and 19B, a lower shield film 96 is formed on a substrate 94. On the shield film, an insulator film 92 and an element-forming layer 215 are formed, on which another insulating film 93 and an upper shield film 95 are formed.

The element-forming layer 215 includes a first junction (Josephson junction) 97a and a second junction (Josephson junction) 97b. The first junction comprises a first electrode 98a, a weak link 100a and a connecting electrode 101. The second junction comprises a second electrode 98b, a weak link 100b and a connecting electrode 101. A coupling portion 98c filled with solid dielectric material is disposed between the junctions. The first junction and the second junction are connected in series via the connecting electrode 101. The closest distance between the weak links (100a and 100b) are predetermined not to exceed 10 μm. The critical current values of the junctions (97a, 97b) are different. Therefore, anti-phase coupling is realized via magnetic flux coupling of the adjacent weak links (100a, 100b), or via electromagnetic coupling due to an electromagnetic wave emitted by Josephson oscillation in both junctions. As a result, a superconducting junction device is formed. A resonance circuit element 99 of inductive reactance including meander line is connected in parallel to the second electrode 98b and the connecting electrode 101 of the end part of the second junction 97b. The second junction has the smaller critical current. An output terminal 102 is connected to the second electrode 98b. According to this example, an easier process of manufacturing planar weak link element can be used. The process depends on a photo process, and thus the method is distinct from that of manufacturing a laminated non-linear characteristic element. This is one of the advantages of this invention.

Even if the closest distance between the weak links exceeds 10 μm, the element functions as an oscillator due to the anti-phase coupling. However, the distance, preferably, should not exceed 10 μm for practical use.

The construction of the weak links (100a, 100b) is not limited to FIGS. 19A and 19B. Other constructions like a Dayem bridge, a variable-thickness bridge (VTB)(cf. "PHYSICS AND APPLICATIONS OF THE JOSEPHSON EFFECT", p.167), a proximity-effect micro bridge, and a step-edged type bridge having steps may also be used.

Moreover, according to this embodiment, the shield films (95, 96) are attached to the surfaces of the element-forming layer. Due to the shielding effect, strong anti-phase coupling is realized between the junctions and a large non-linear characteristic can be obtained. These shield films can be attached on at least one surface of the element-forming layer. A construction without any shield films may also be used.

In this example, a solid dielectric material is filled into the coupling portion 98c. However, the coupling portion may be an air-filled space.

EXAMPLE 10

The above-mentioned superconducting oscillator having planar construction can be manufactured more easily than a lamination oscillator. For instance, the superconducting thin film is formed by the method described in Example 8. The pattern of the element-forming layer can be formed by a photo process, and etched by Ar ion milling. The insulating film 93 and the shield film 95 are then formed by using a well-known technique, such as a sputtering.

In Examples 6, 7 and 9, the resonance circuit elements are connected in parallel between the terminals of the junction having the lower critical current. The resonance circuit element can be connected in series to the second upper electrode of the second junction and to the bias circuit. It is also possible that the resonance circuit element 72c or 72d may be connected in series or in parallel between the terminals of the second junction 71b as shown in FIG. 16.

In Example 9, the output terminal 102 is connected to the outermost electrode of the junction having the smaller critical current. The output power can also be extracted from the connecting electrode which serially connects the junction having the smaller critical current. The power may also be extracted from the terminals of the junctions having the smallest value. Various conventional techniques, like a trans-coupling, may also be used.

In Examples 6–9, inductive reactances like a meander line and a strip line are explained as the resonance circuit elements. Resonance circuit elements will be used if they can be combined with the equivalent impedance of the junction having the smaller critical current in order to compose a resonance circuit. A serial-parallel resonance tank circuit, a load resistance etc. can be used in addition to an inductor.

Though the characteristics of the superconducting oscillator of the Examples are similar, the superconducting oscillator shown in FIG. 17 is explained.

The first and second lower electrodes (the superconducting thin film material) comprise $Bi_2Sr_2Ca_1Cu_2O_x$. The barrier layer 79 comprises $Bi_2Sr_2Cu_1O_x$. The element is about 50 nm thick. The inner dimension of the substrate of the first junction 71a is 10 $\mu$m×10 $\mu$m, the inner dimension of the substrate of the second junction 71b is 10 $\mu$m×5 $\mu$m. The gap (the width of the coupling portion 11c) between the junctions is 2 $\mu$m. At 4.2 Kelvin, the critical current values of the junctions 71a and 71b are 1 mA and 0.5 mA, and the normal conductive resistances are 1.0 $\Omega$ and 2.2 $\Omega$ respectively. The stripline-shape resonance circuit element 81 is combined with the connecting electrode 82 to have an inductance of about 4 nH. The power source 75 is a variable voltage source, and the value of the load resistance 74 is 10 k$\Omega$.

The output was measured by using a spectral analyzer after connecting a transmission line of 50 $\Omega$ to both terminals of the second junction 71b. When the bias current I flows, an oscillation output having a high frequency spectral purity was obtained. At that time, the resonant frequency of the parallel resonance circuit comprising the inductance of the resonance circuit element 81 and the capacitance (about 30 fF) of the second junction 71b is about 14 GHz. When the bias current I is about 1 mA, the maximum oscillation output of about 0.1 $\mu$W was obtained. This value is larger by several orders of magnitude than the oscillation output of a single Josephson junction.

Figure 20:
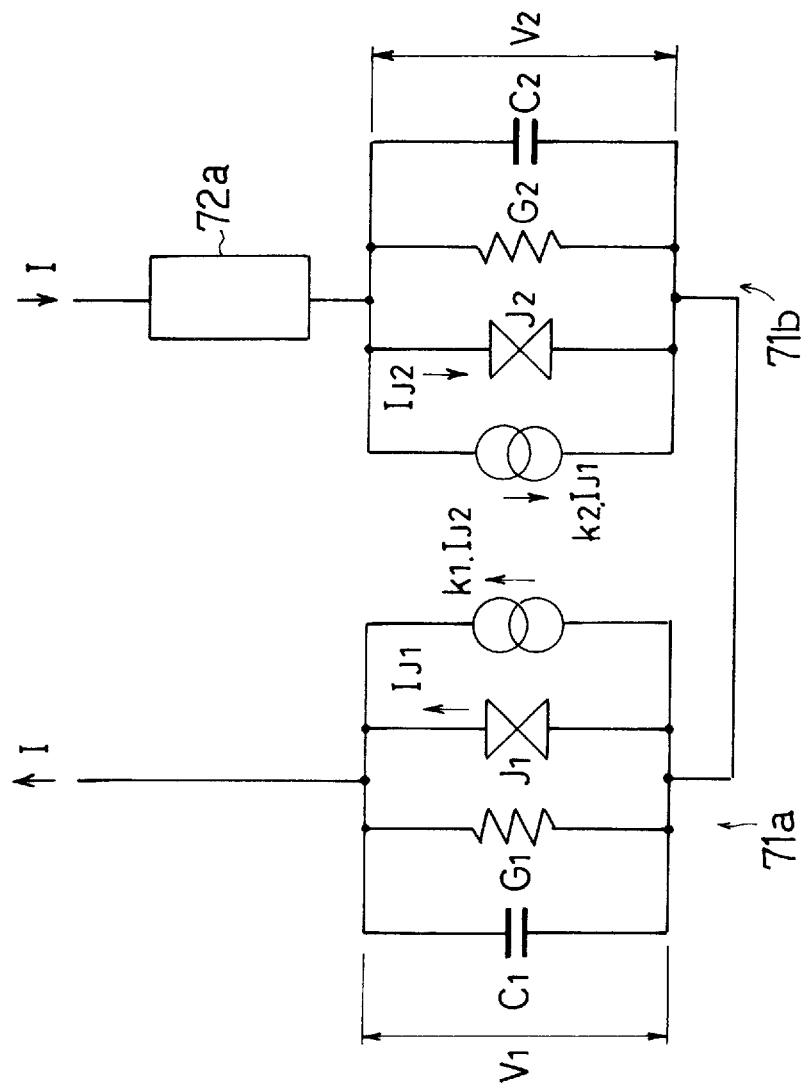
FIG. 20 is a diagrammatic view of an equivalent circuit using RSJ model with which the operation of the superconducting junction according to Example 10 of this invention is explained.
Figure 21:
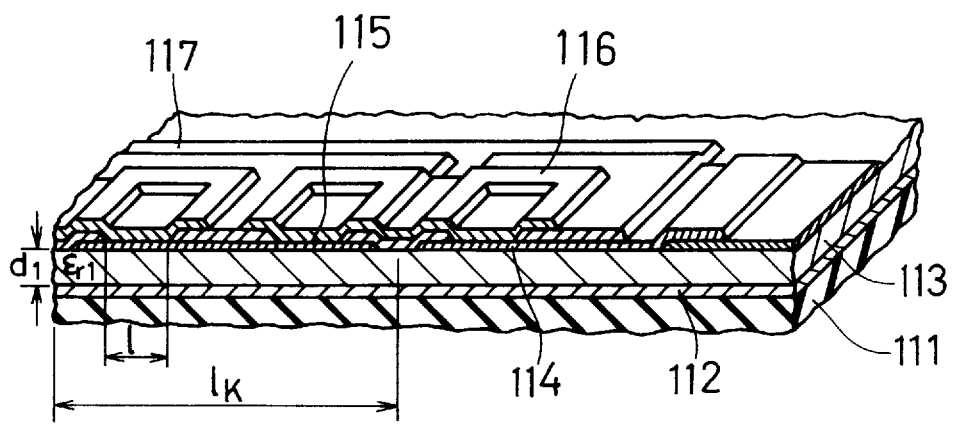
FIG. 21 is a partially cutaway view in perspective of a voltage standard element as one example of a conventional non-linear characteristic element.
Figure 22:
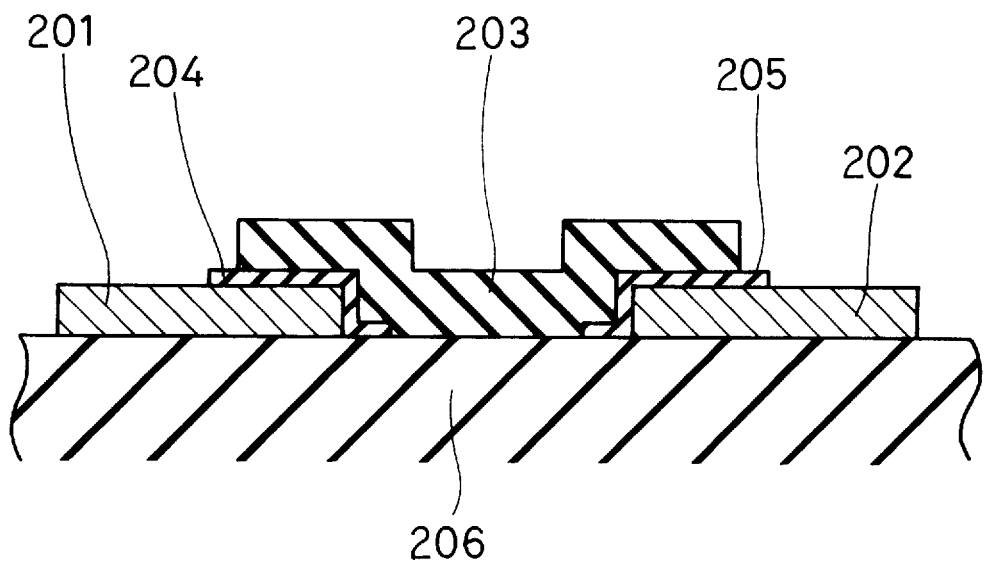
FIG. 22 is a cross-sectional view to show the construction of a conventional non-linear characteristic element.

Next, this phenomenon will be explained referring to a resistively shunted junction (RSJ) model. FIG. 20 shows a equivalence circuit of a superconducting oscillator using RSJ model, in which the resonance circuit element 72a is connected in series (see FIG. 14). As shown in FIG. 20, capacitance $C_1$ and conductance $G_1$ are connected in parallel to the Josephson current $I_{J1}$ without coupling to the first junction 71a. And the coupled current $K_1 \cdot I_{J2}$ flows in parallel to $I_{J1}$. The second junction 71b has a similar construction. The first junction 71a and the second junction 71b are connected in series. The resonance circuit element 72a is connected in series to the second junction 71b. The coupling corresponds to an anti-phase coupling where the coupling coefficients $k_1$ and $k_2$ are negative. The equation to indicate the function of the equal circuit are given in equations (1) to (4).

According to the second junction 71b, coupling current $K_2 \cdot I_{J1}$ flows in parallel to $I_{J2}$. The Josephson current $I_{J2}$ of the second junction 71b is given as a linear subordinate function of the terminal voltage $V_2$ (with a phase difference $\phi_2$). The terminal voltage $V_2$ is principally determined from the Josephson current $I_{J2}$ and the coupled current $K_1 \cdot I_{J2}$ when the bias current I is a subsidiary parameter. The system of the first junction is the same. If the coupling coefficients $k_1$ and $k_2$ are positive numbers or zero (zero coupling), phase synchronization occurs via the terminal voltages ($V_1$, $V_2$) of each junction. As a result, oscillation similar to that of a single Josephson junction will occur. On the other hand, when the coupling coefficients are not positive numbers, the phase of $I_{J1}$ and $I_{J2}$, and the phases of $k_1 \cdot I_{J2}$, $k_2 \cdot I_{J1}$ do not correspond. Therefore, the terminal voltages ($V_1$, $V_2$) of each junction are independent. In other words, there are two independent parameters to the oscillation circuit. Therefore, when a resonance circuit element is connected to one junction, especially to the end of the junction having the lower critical current, oscillation power of the resonance frequency from the second junction 1b is supplied to the resonance circuit comprising capacitance $C_2$ and conductance $G_2$ and the resonance circuit element. In addition, the coupling current $k_2 \cdot I_{J1}$ supplements the Josephson current $I_{J2}$ and supplies the resonance circuit with oscillation component current, therefore the resonance power becomes greater. The purity of the oscillation frequency will also improve because it depends on the circuit elements such as the resonance circuit or band-pass filter. Especially, when the bias current I is the same or exceeds the minimum critical current of the junctions (in a case of two junctions, the critical current value of the first junction), average voltage is generated at the coupled junction. Therefore, Josephson oscillation of the junction itself occurs and the current flows into the second junction, having the lower critical current, and becomes in a competing oscillation state. As a result, a large, combined plural current flows into the junction, and an oscillation output having a larger amplitude can be obtained at the resonance circuit. Therefore, the oscillation efficiency becomes the optimum around the bias current in the beginning of the a competing oscillation state.

The invention may be embodied in other forms without departing from the spirit or essential characteristics thereof. The embodiments disclosed in this application are to be considered in all respects as illustrative and not restrictive, the scope of the invention is indicated by the appended claims rather than by the foregoing description, and all changes which come within the meaning and range of equivalency of the claims are intended to be embraced therein.

What is claimed is:

1. A superconducting junction device, comprising a plurality of Josephson junctions, having different critical current values, the Josephson junctions being connected in series, having a dielectric coupling portion disposed between the junctions, the portion having a width of less than 10 $\mu$m, wherein a Josephson junction has non-linear current-voltage characteristics at a current around the critical current of an adjacent Josephson junction with higher critical current value.

2. The superconducting junction device according to claim 1, further comprising a bias circuit for supplying current to the junctions, and a resonance circuit element connected between electrodes of a Josephson junction having a lower critical current value.

3. The superconducting junction device according to claim 2, further comprising a band-pass filter, coupled capacitively or electromagnetically to at least one of the elements selected from the group consisting of a resonance circuit element and electrodes of the Josephson junction having a lower critical current value.

4. The superconducting junction device according to claim 1, wherein a first and a second Josephson junctions are connected in series so that a Josephson current flowing in a first Josephson junction and another current induced by the second Josephson junction in the first Josephson junction by either magnetic flux coupling via a coupling portion, or electromagnetic coupling via an electromagnetic wave emitted by the second Josephson junction have different relative phases.

5. The superconducting junction device according to claim 1, wherein Josephson currents of the Josephson junctions are coupled in anti-phase and the Josepson junctions are connected in series by adjacently disposing two layered-type Josephson junctions across a coupling portion and each layered-type Josephson junction is formed by laminated-type a lower electrode, a barrier layer of a dielectric or a conductor, and an upper electrode.

6. The superconducting junction device according to claim 5, wherein a reflecting wall, comprising either a superconductor or a Josephson junction, is provided around the Josephson junctions and around the coupling portion.

7. The superconducting junction device according to claim 1, wherein an electrode of a first Josephson junction and an electrode of a second Josephson junction are connected in series, the first and second Josephson junctions having first and second Josephson currents respectively, the first and second Josephson currents being coupled by the coupling portion in anti-phase.

8. The superconducting junction device according to claim 7, wherein a superconducting shield film is provided across a dielectric, the dielectric surrounding the Josephson junctions and the coupling portion.

9. The superconducting junction device according to claim 1, wherein first and second weak link-type Josephson junctions are adjacently formed on a substrate, separated by a coupling portion, the first and second junctions having first and second electrodes respectively, the first and second electrodes being connected in series, the first and second junctions having first and second Josephson currents respectively, the first and second currents being coupled by the coupling portion in anti-phase.

10. The superconducting junction device according to claim 9, wherein a superconducting reflecting wall is formed across a dielectric on at least one of the group consisting of a lower face, an upper face and side of the two weak link-type Josephson junctions including the coupling portion.

11. The superconducting junction device according to claim 1, wherein either an external capacitor or an external resistance is electrically connected in parallel to at least one of the Josephson junctions.

12. The superconducting junction device according to claim 1, wherein at least one of the Josephson junctions has electrodes composed of an oxide superconductor.

* * * * *